United States Patent [19]

Masuda et al.

[11] Patent Number: 4,962,486
[45] Date of Patent: Oct. 9, 1990

[54] BOUNDARY-FREE SEMICONDUCTOR MEMORY DEVICE HAVING A PLURALITY OF SLIDE ACCESS MEMORIES

[75] Inventors: Yusuke Masuda; Junji Ogawa, both of Kawasaki, Japan

[73] Assignee: Fujitsu Limited, Kawasaki, Japan

[21] Appl. No.: 204,135

[22] Filed: Jun. 8, 1988

[30] Foreign Application Priority Data

Jun. 10, 1987 [JP] Japan .................. 62-143254

[51] Int. Cl.[5] .............................. G11C 7/00
[52] U.S. Cl. .................. 365/230.03; 365/189.08; 365/238.5; 340/799
[58] Field of Search ........ 365/230.03, 189.08, 365/238.5; 340/799

[56] References Cited

U.S. PATENT DOCUMENTS 4,811,297  3/1989  Ogawa ................. 365/230.03

FOREIGN PATENT DOCUMENTS 0209749  1/1987  European Pat. Off. .
59-110086  6/1984  Japan .
59-180324  10/1984  Japan .
61-58058  3/1986  Japan .

Primary Examiner—Stuart N. Hecker
Assistant Examiner—Michael A. Whitfield
Attorney, Agent, or Firm—Armstrong, Nikaido, Marmelstein, Kubovcik & Murray

[57] ABSTRACT

A plurality of slide access memories ($SM_{00}$, $SM_{01}$, ..., $SM_{n-1, m-1}$), in which a voluntary rectangular group of bits can be accessed, are arranged in an n-rows and m-columns matrix and connected to common data lines ($D_0$, $D_1$, ..., $D_{15}$). A first access means accesses the same rectangular group of bits in each of the slide access memories and interconnects these groups to input/output portions incorporated into each of the slide access memories. A second access means selects the input/output portions of each of the slide access memories to enable or disable the operation thereof in accordance with a special bit position, or a pointing bit (PB) position, to thereby connect only a desired group of bits to common data lines, and thus enlarge the scope of slide access memories.

12 Claims, 28 Drawing Sheets

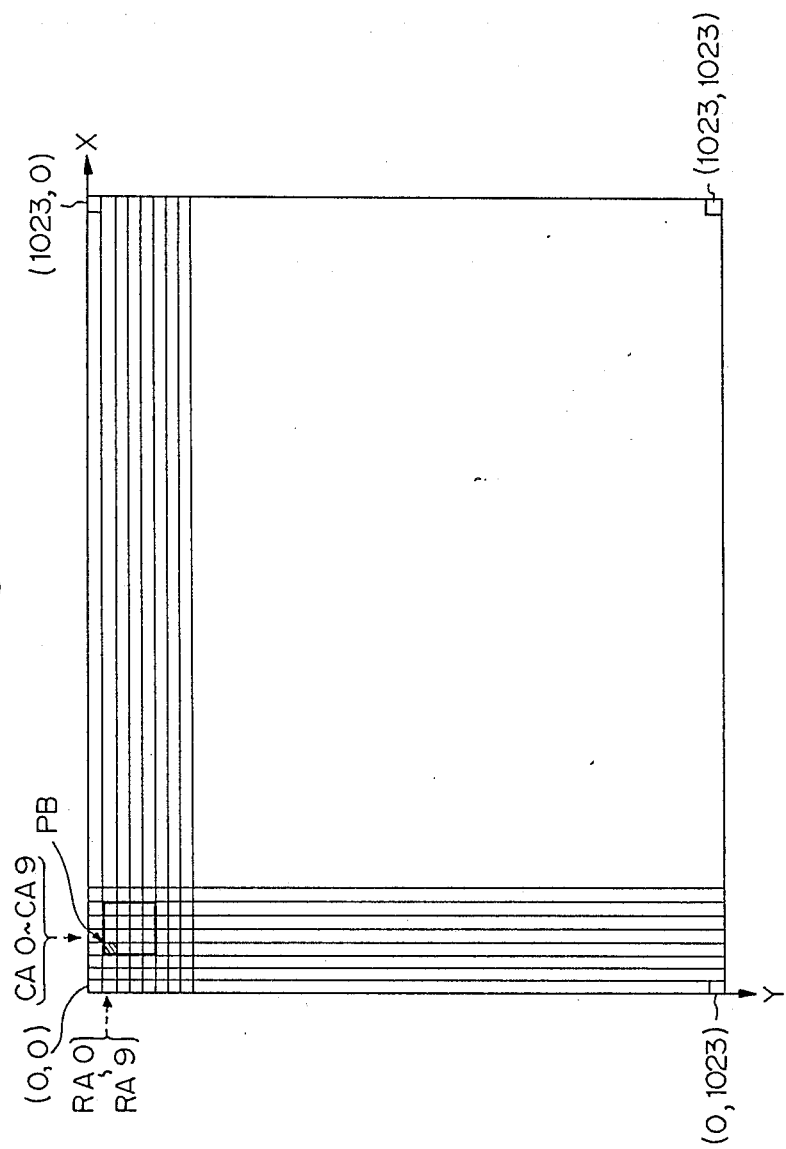

PB

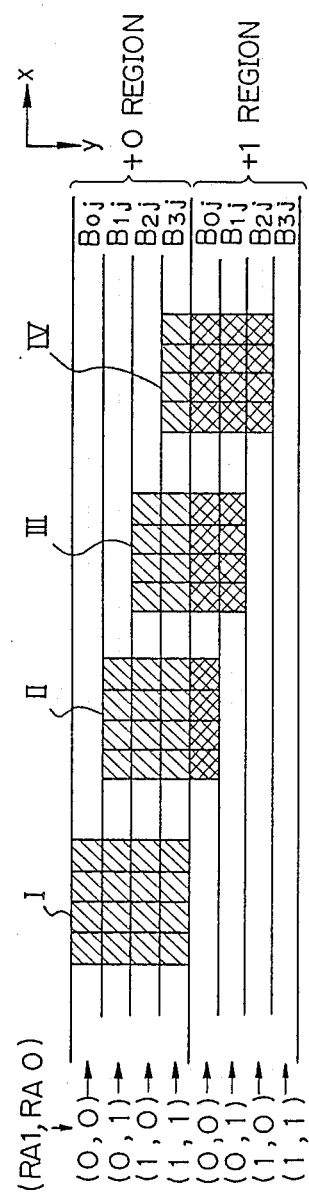

Fig. 22A

| PB | | | |
|---|---|---|---|
| MD$_0$ | MD$_1$ | MD$_2$ | MD$_3$ |
| MD$_4$ | MD$_5$ | MD$_6$ | MD$_7$ |
| MD$_8$ | MD$_9$ | MD$_{10}$ | MD$_{11}$ |
| MD$_{12}$ | MD$_{13}$ | MD$_{14}$ | MD$_{15}$ |

Fig. 22B

| | PB | | |
|---|---|---|---|
| MD$_1$ | MD$_2$ | MD$_3$ | MD$_9$ |
| MD$_8$ | MD$_0$ | MD$_4$ | MD$_{10}$ |
| MD$_7$ | MD$_6$ | MD$_5$ | MD$_{11}$ |
| MD$_{15}$ | MD$_{14}$ | MD$_{13}$ | MD$_{12}$ |

BOUNDARY-FREE SEMICONDUCTOR MEMORY DEVICE HAVING A PLURALITY OF SLIDE ACCESS MEMORIES

BACKGROUND OF THE INVENTION

1) Field of the Invention

The present invention relates to a semiconductor memory device, and more particularly, to the enlargement of a boundary-free semiconductor memory device (hereinafter, referred to as a slide access memory) in which data in two-dimensional memory cells including data in a memory cell designated by an address signal is accessed.

The semiconductor memory device according to the present invention can be used in multi-dimensional data processing such as video data processing.

2) Description of the Related Art

In video data processing or the like, a video memory device is used for storing video data, and such a device often stores video data in correspondence with pictures displayed in a graphic display or the like. For video data between adjacent addresses stored in such a device, data processing or dust removing processing such as compression processing, difference processing, smoothing processing, and the like are often carried out, and for such processing in addition to access to a desired memory cell, it is necessary to access data in memory cells at the periphery of the desired memory cell. Therefore, in a video memory or the like a prompt access to memory cells at the periphery of a desired memory cell, as well as the memory cell per se, is required.

Also, the above-mentioned requirement is applied to processing for accessing every word unit such as a matrix calculation and three-dimensional data processing, as well as processing for accessing every memory cell unit. The efficiency of this type of processing is improved by providing a function for promptly reading stored data of adjacent addresses.

For this purpose, the applicant has already suggested a boundary-free semiconductor memory device (slide access memory) in which the rectangular shape of accessed bits can be easily reduced or enlarged, and the large capacity and high integration of the device are not affected (see U.S. Pat. No. 811,297).

When a memory system is extended by using a plurality of the above-mentioned slide access memories, the same rectangular group of bits, such as 4×4 bits, are accessed for each slide access memory, and thereafter, only the 4×4 bits including a pointing bit PB are valid and the other bits are invalid. For this purpose, a boundary-free semiconductor memory device including a plurality of slide access memories may be considered, but the size of this type of memory device is greatly increased, because the connections of data lines and the number of elements are increased, as explained later in more detail.

SUMMARY OF THE INVENTION

Therefore, an object of the present invention is to provide a boundary-free semiconductor memory device including a plurality of slide access memories, on a small scale.

According to the present invention, a plurality of slide access memories, in which a voluntary rectangular group of bits can be accessed, are arranged in an n-rows and m-columns matrix, and connected to common data lines. A first access means accesses the same rectangular group of bits in each of the slide access memories and interconnects these bit groups to the input/output portion incorporated into each of the slide access memories. A second access means selects the input/output portions of each of the slide access memories to enable on disable the operation thereof in accordance with a special bit position, or a pointing bit position, thereby connecting only a desired group of bits to common data lines and thus enlarging the scope of the slide access memories.

BRIEF DESCRIPTION OF THE DRAWINGS

The present invention will be more clearly understood from the description as set forth below constrasting the present invention with the related art, with reference to the accompanying drawings, wherein:

FIG. 1 is a diagram illustrating a bit map configuration of a slide memory system before enlargement;

FIG. 18 is a diagram explaining a row boundary-free chip;

FIG. 19A through 19C are diagrams showing data of the accessed cell blocks of FIG. 12;

FIGS. 22A and 22B are diagrams explaining the location of the pointing bit;

DESCRIPTION OF THE PREFERRED EMBODIMENTS

A boundary-free slide access memory (chip) is now explained with reference to FIG. 1.

FIG. 1 shows a logical bit map configuration of 1Mbits. Namely, 1024 memory cells are arranged along the X-direction, and 1024 memory cells are arranged along the Y-direction. In this case, a selection of one row is carried out by 10 bits of row address signals RA0 to RA9, and a selection of one column is carried out by 10 bits of column address signals CA0 to CA9. Note, it is considered at this point that a rectangular bit group of 4×4 bits are simultaneously accessed. In this case, when a pointing bit PB is indicated and accessed on the bit map, peripheral bits (surrounded by a thick line) are also accessed. Since any bit on the bit map can be such a pointing bit PB, no boundary exists within a chip, and thus the chip is a boundary-free memory device.

Figure 2A:
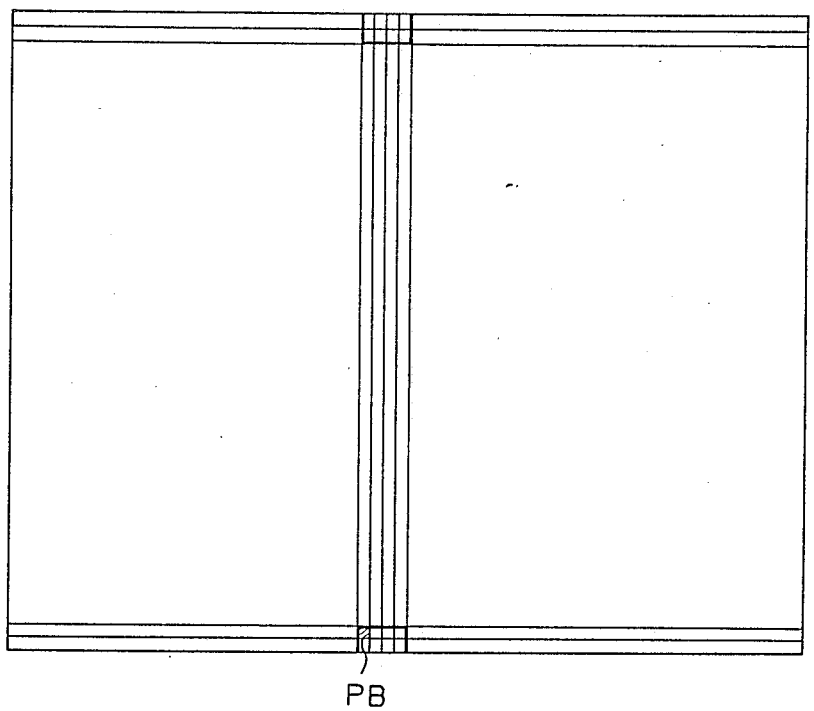
FIGS. 2A to 2C are diagrams explaining boundary-free chips.
Figure 2B:
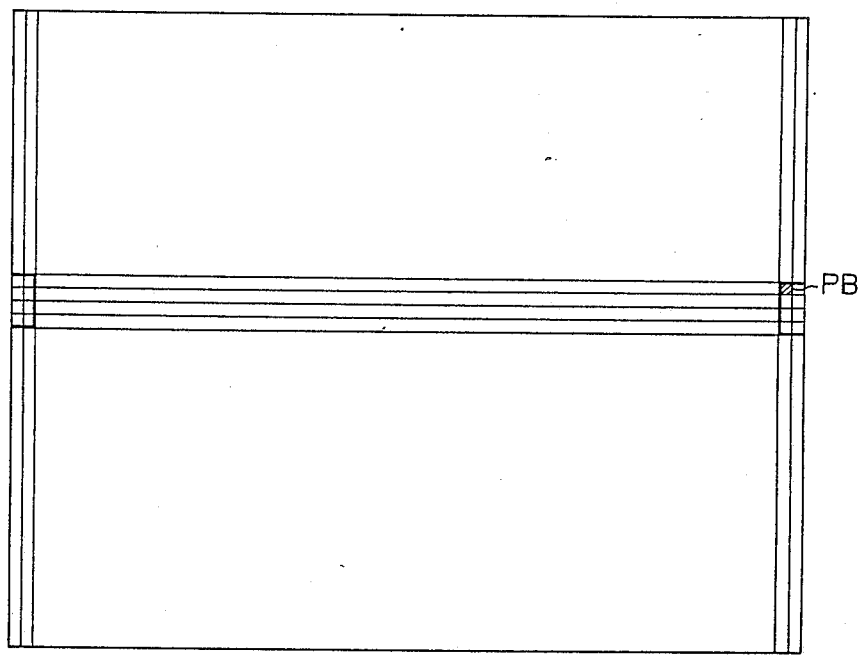
Figure 2C:
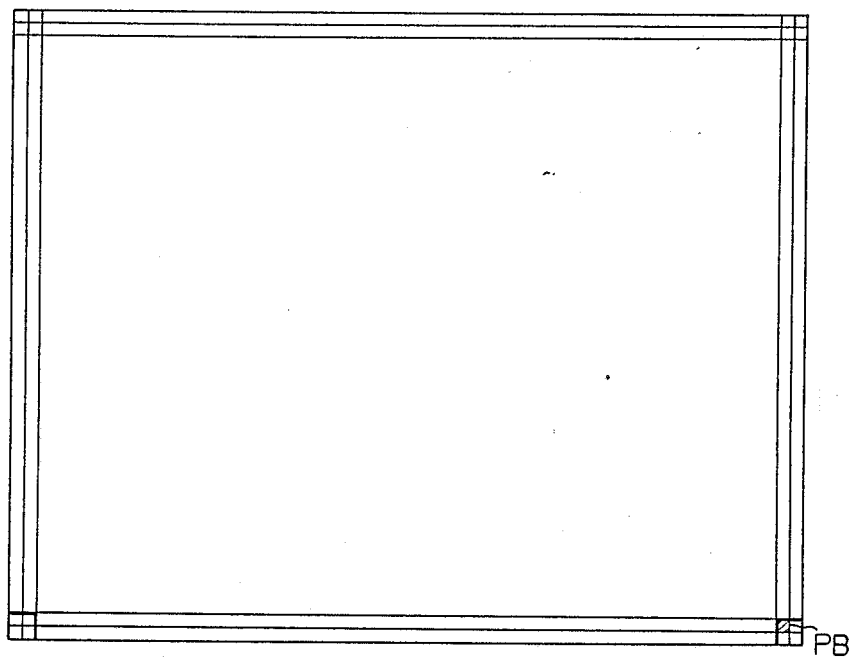
Figure 3:
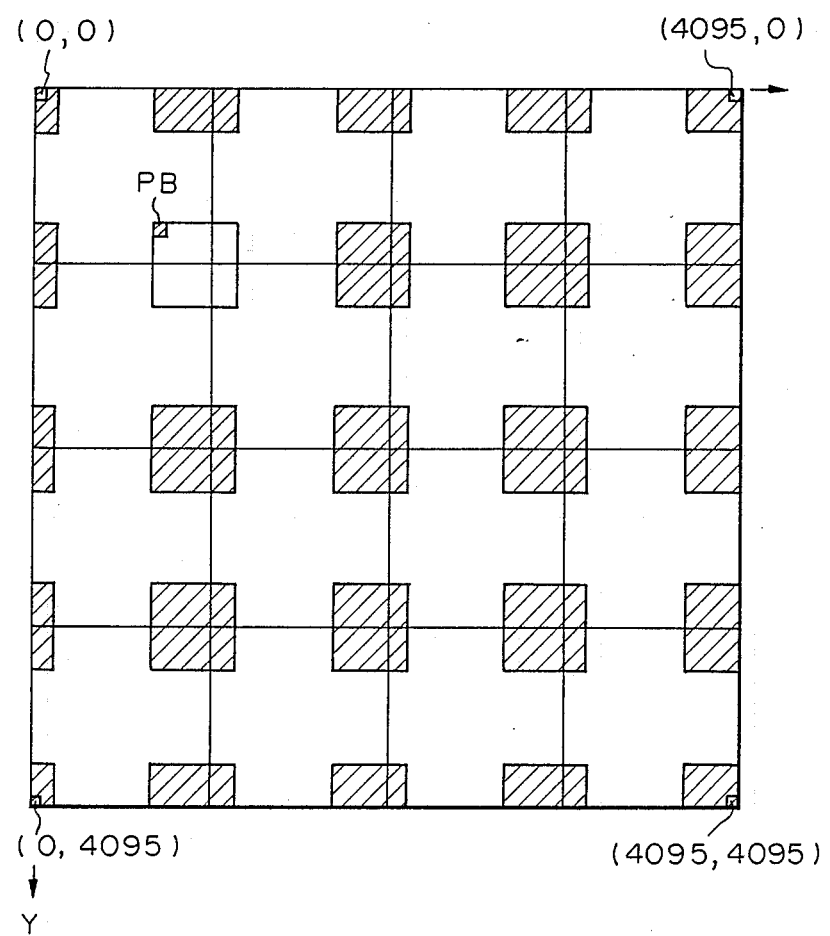
FIG. 3 is a diagram illustrating a bit map configuration of a slide access memory system after enlargement.

When the pointing bit PB approaches the boundary of the chip, a chip boundary exists and, in order to eliminate this chip boundary, the boundary is cycled. For example, as illustrated in FIG. 2A, when the boundary of an accessed bit group exceeds a row boundary of the chip, a region of small row addresses is simultaneously accessed. Also, as illustrated in FIG. 2B, when the boundary of an accessed bit group exceeds a column boundary of the chip, a region of small column addresses is simultaneously accessed. Further, as illustrated in FIG. 2C, when the boundary of an accessed bit group exceeds both the row boundary and the column boundary, a region of small row addresses and small column addresses is simultaneously accessed and thus, a chip boundary-free semiconductor memory device is obtained.

Figure 4:
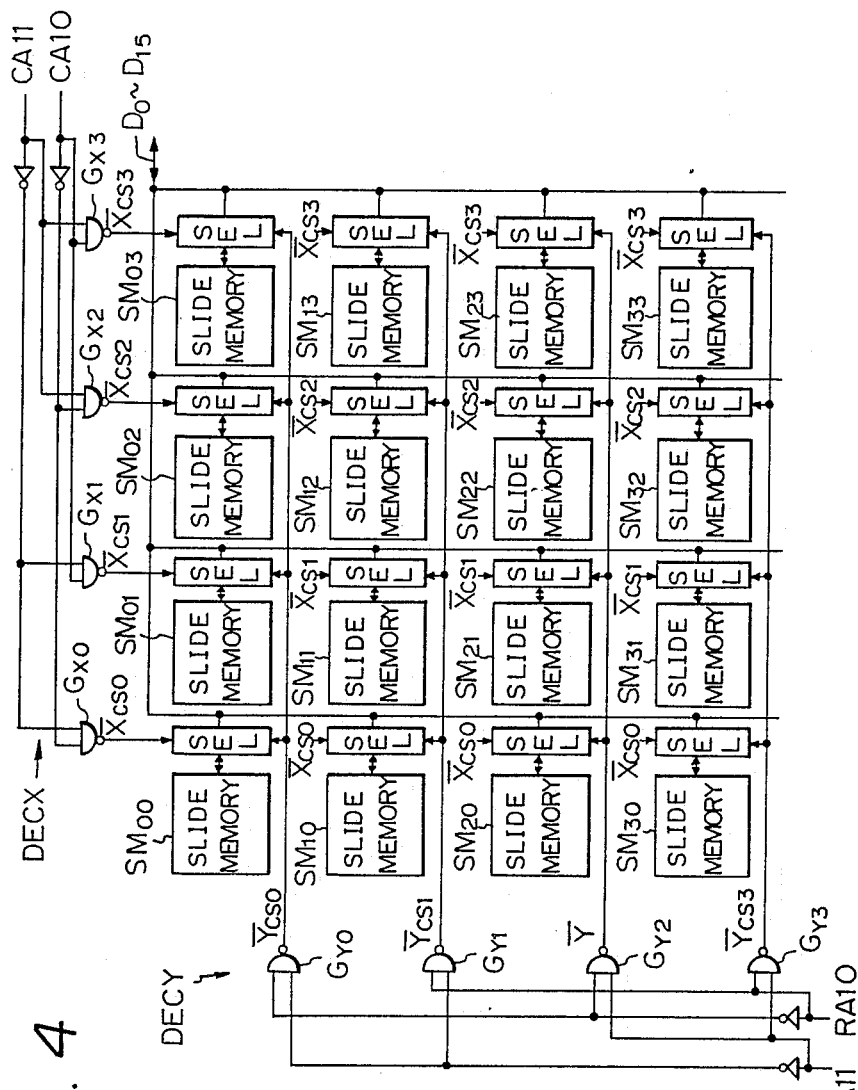
FIG. 4 is a block circuit diagram illustrating an example of a suggested slide access memory system after enlargement.

When a memory system is extended by using a plurality of the above-mentioned slide access memories, for example, by using sixteen slide access memories (1 Mbits), the same group of 4×4 bits are accessed for each memory, and thereafter, only the 4×4 bits including a pointing bit PB are valid, i.e., output, and the other accessed indicated by shaded portions are invalid. For this purpose, a suggested slide memory system after enlargement is illustrated on FIG. 4. In FIG. 4, a selector SEL is provided for each of the slide access memories $SM_{00}$, $SM_{01}$, ..., and $SM_{33}$, and chip select signals $\overline{X}_{cs0}$, $\overline{X}_{cs1}$, $\overline{X}_{2}$, and $\overline{X}_{cs3}$ from an X decoder DECX and chip select signals $\overline{Y}_{cs0}$, $\overline{Y}_{cs1}$, $\overline{Y}_{cs2}$, and $\overline{Y}_{cs3}$ from an Y decoder DECY are supplied to all of the selectors SEL, thereby accessing a desired rectangular group of 4×4 bits.

Note that the X decoder DECX (or the Y decoder DECY) receives two column address signals CA10 and CA11 (or two row address signals RA10 and RA11), to make one of the chip select signals $\overline{X}_{cs0}$, $\overline{X}_{cs1}$, $\overline{X}_{cs2}$, and $\overline{X}_{cs3}$ (or the chip select signals $\overline{Y}_{cs0}$, $\overline{Y}_{cs1}$, $\overline{Y}_{cs1}$, and $\overline{Y}_{cs2}$) low level. For this purpose, the X decoder DECX (or the Y decoder DECY) is comprised of tour NAND circuits $G_{X0}$, $G_{X1}$, $G_{X2}$, and $G_{X3}$ (or $G_{Y0}$, $G_{Y1}$, $G_{Y2}$, and $G_{Y3}$).

But, as can be seen in FIG. 4, the size of the entire system is increased because a selection of 4 ×4 bits for each slide access memory is carried out from the exterior of the slide access memories. Also, the connections for the selectors are increased, thus increasing the power consumption, i.e., reducing the efficiency, and increasing the cost of manufacturing the memory system.

Figure 5:
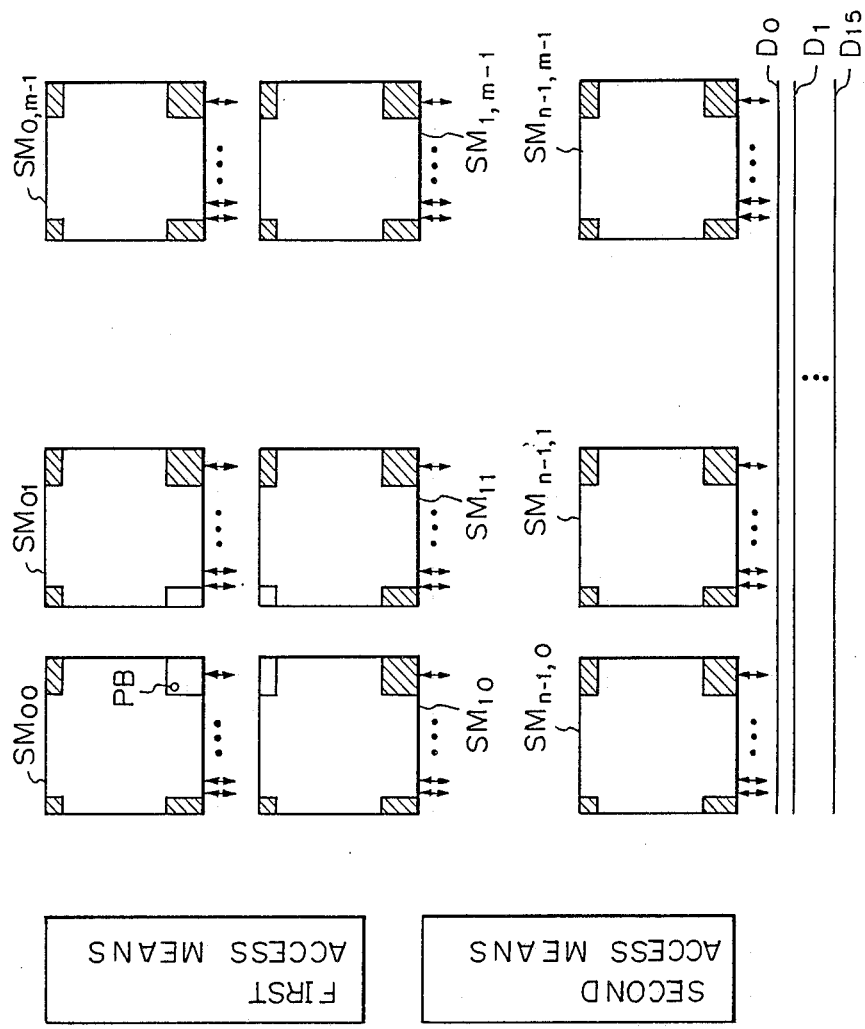
FIG. 5 is a block circuit illustrating a basic configuration according to the present invention.

In FIG. 5, which illustrates a basic configuration showing a principle of the present invention, slide access memories $SM_{00}$, $SM_{01}$, ..., and $SM_{n-1, m-1}$ are arranged in an n rows × m column matrix. These slide access memories incorporate input/output portions, and an access of a voluntary rectangular group of bits is possible. Further, for example, sixteen data lines $D_0$ to $D_{15}$ are commonly connected to the input/output portions of the slide access memories, and a first access means accesses the same rectangular group of bits for each of the slide access memories to interconnect these groups to the input/output portions thereof. A second access means selects each bit of the input/output portions of the slide access memories to enable or disable the operation of each selected bit.

That is, in FIG. 5, the first access means accesses the same rectangular group of bits, but this is often split due to the boundary-free configuration, as shown in FIG. 5, of each of the slide access memories, and the second access means enables or disables each bit of the input/output portions of the slide access memories. For example, in the slide access memory $SM_{00}$, the input/output portions connected to a frame portion including a pointing bit PB are enabled, and the input/output portions connected to the other shaded portions are disabled in for example, a high impedance state. Similarly, in the slide access memories $SM_{01}$, $SM_{10}$, and $SM_{11}$, the input/output portions connected to framed portions, and the input/output portions connected to shaded portions are disabled. In the other slide access memories, all of the input/output portions are disabled, and as a result, a rectangular group of bits including the pointing bit PB extending over the four slide access memories $SM_{00}$, $SM_{01}$, $SM_{10}$, and $SM_{11}$ is connected to the data lines $D_0$ to $D_{15}$.

Figure 6:
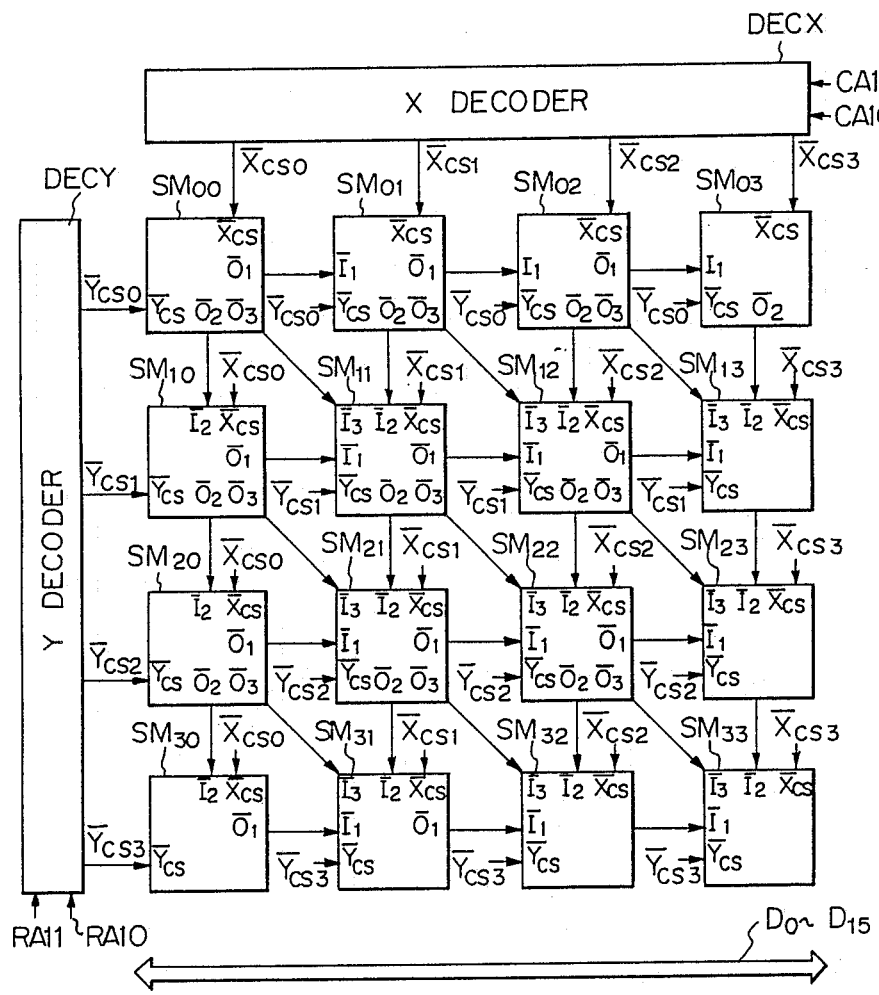
FIG. 6 is a block circuit diagram illustrating a first embodiment of the boundary-free semiconductor memory device according to the present invention.

In FIG. 6, which is a first embodiment of the present invention realizing the principle of FIG. 5, slide access memories $SM_{00}$, $SM_{01}$, ..., and $SM_{33}$ (each of which is comprised of 1 Mbits) are arranged in four-rows and four-columns. The memories $SM_{00}$, $SM_{10}$, $SM_{20}$, and $SM_{30}$; $SM_{01}$, $SM_{11}$, $SM_{21}$, and $SM_{31}$; $SM_{02}$, $SM_{12}$, $SM_{22}$, and $SM_{32}$; and $SM_{03}$, $SM_{13}$, $SM_{23}$, and $SM_{33}$ are selected by the chip select signals $\overline{X}_{cs0}$, $\overline{X}_{cs1}$, $\overline{X}_{cs2}$, and $\overline{X}_{cs3}$, respectively of the X decoder DECX, and the memories $SM_{00}$, $SM_{01}$, $SM_{02}$, and $SM_3$; $SM_{10}$, $SM_{11}$, $SM_{12}$, and $SM_{13}$; $SM_{20}$, $SM_{21}$, $SM_{22}$, and $SM_{23}$; and $SM_{30}$, $SM_{31}$, $SM_{32}$, and $SM_{33}$ are selected by the chip select signals $\overline{Y}_{cs0}$, $\overline{Y}_{cs1}$, $\overline{Y}_{cs2}$, and $\overline{Y}_{cs3}$ respectively, of the Y decoder DECY. Note that the selectors SEL of FIG. 4 are not provided.

That is, the memory such as $SM_{00}$ including a pointing bit PB is activated by the chip select signals $\overline{X}_{cs0}$ and $\overline{Y}_{cs0}$, and this pointing bit PB is selected by the row address signals RA0 to RA9 and the column address signals CA0 to CA9 (not shown). As a result of decoding the row address signals RA0 to RA9 and the column address signals CA0 to CA9, when it is necessary to access the adjacent memories $SM_{01}$, $SM_{10}$, or $SM_{11}$ other than the memory $SM_{00}$, a data request signal is transmitted from a terminal $\overline{O}_1$, $\overline{O}_2$, or $\overline{O}_3$ of the memory $SM_{00}$ to a terminal $\overline{I}_1$, $\overline{I}_2$, or $\overline{I}_3$ of the memory $SM_{01}$, $SM_{10}$, or $SM_{11}$. Note that various control signals RAS, CAS, R/$\overline{W}$, OE, and the like (not shown) other than the row address signals RA0 to RA9 and the column address signals CA0 to CA9 are supplied commonly to the memories $SM_{00}$, $SM_{01}$, ..., and $SM_{33}$.

Figure 7:
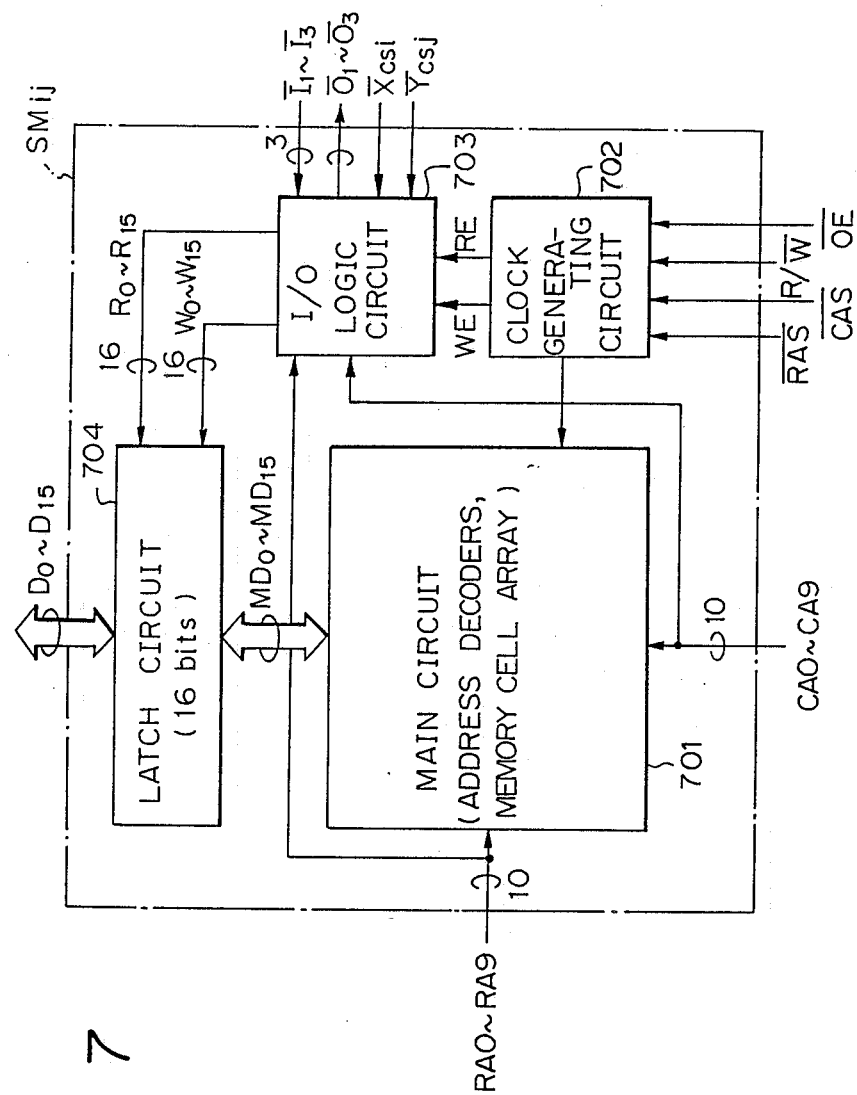
FIG. 7 is a block diagram of the slide access memory device (chip) of FIG. 6.

In FIG. 7, which is a detailed block circuit diagram of the slide access memory $SM_{ij}$ of FIG. 6, reference 701 designates a main circuit including address decoders, a memory cell array, 702 a clock generating circuit for generating various clock signals, and 703 an input/output (I/O) logic circuit for generating bit mask read signals $R_0$ to $R_{15}$ and bit mask write signals $W_0$ to $W_{15}$ for controlling the latch circuit 704. The latch circuit 704 is used for connecting internal data lines $MD_0$ to $MD_{15}$ to the data lines $D_0$ to $D_{15}$ commonly connected to the memories.

Figure 8:
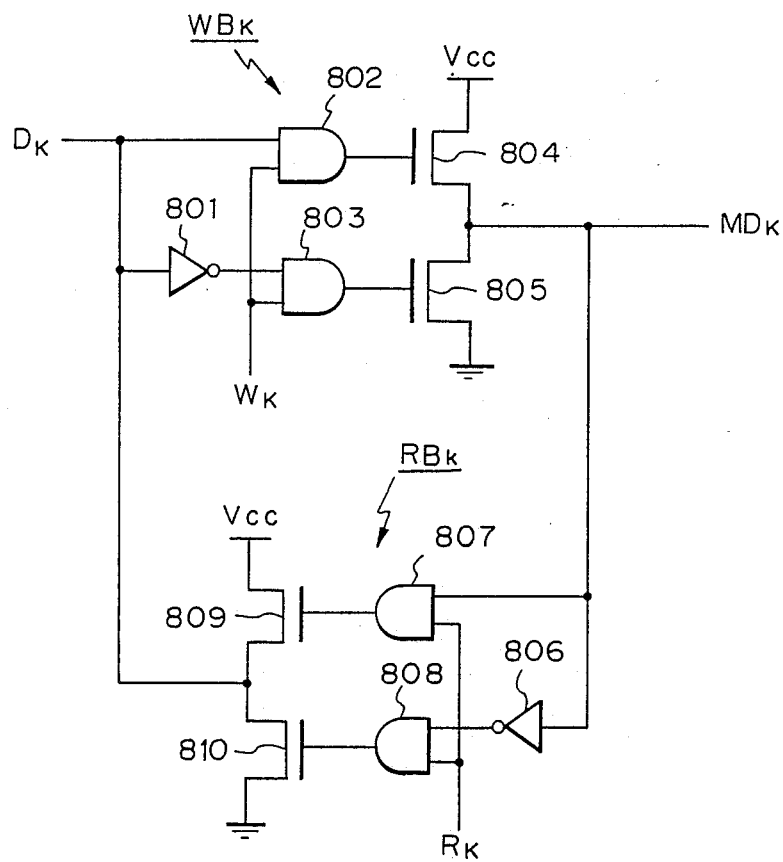
FIG. 8 is a circuit diagram of the latch circuit of FIG. 7.

As shown in FIG. 8, one bit of the latch circuit 704 is comprised of a write buffr $WB_k$ controlled by the bit mask write signal $W_k$ in a write mode, and a read buffer $RB_k$ controlled by the bit mask read signal $R_k$ in a read mode. The write buffer $WB_k$ comprises an inverter 801, AND circuits 802 and 803, and a pushpull circuit formed by N channel MOS transistors 804 and 805. Similarly, the read buffer $RB_k$ comprises an inverter 806, AND circuits 807 and 808, and a pushpull circuit formed by N channel MOS transistors 809 and 810. That is, in the write mode, when the bit mask write signal $W_k$ is at a high level ("1"), the AND circuits 802 and 803 are enabled, i.e., the write buffer $WB_k$ is turned ON, to connect the common data line $D_k$ to the internal data line $MD_k$, and the AND circuits 807 and 808 are disabled, i.e., the pushpull circuit formed by the transistors 809 and 810 are in a high impedance state. Conversely, in the read mode, when the bit mask read signal $R_k$ is at a high level ("1"), the AND circuits 807 and 808 are enabled, i.e., the read buffer $RB_k$ is turned ON, to connect the internal data line $MD_k$ to the common data line $D_k$, and the AND circuits 802 and 803 are disabled, i.e., the pushpull circuit formed by the transistors 804 and 805 are in a high impedance state.

Next, the generation of a mask pattern of the bit mask write signal $W_k$ and the bit mask read signal $R_k$ (k = 0 to 15) will be explained.

Figure 9:
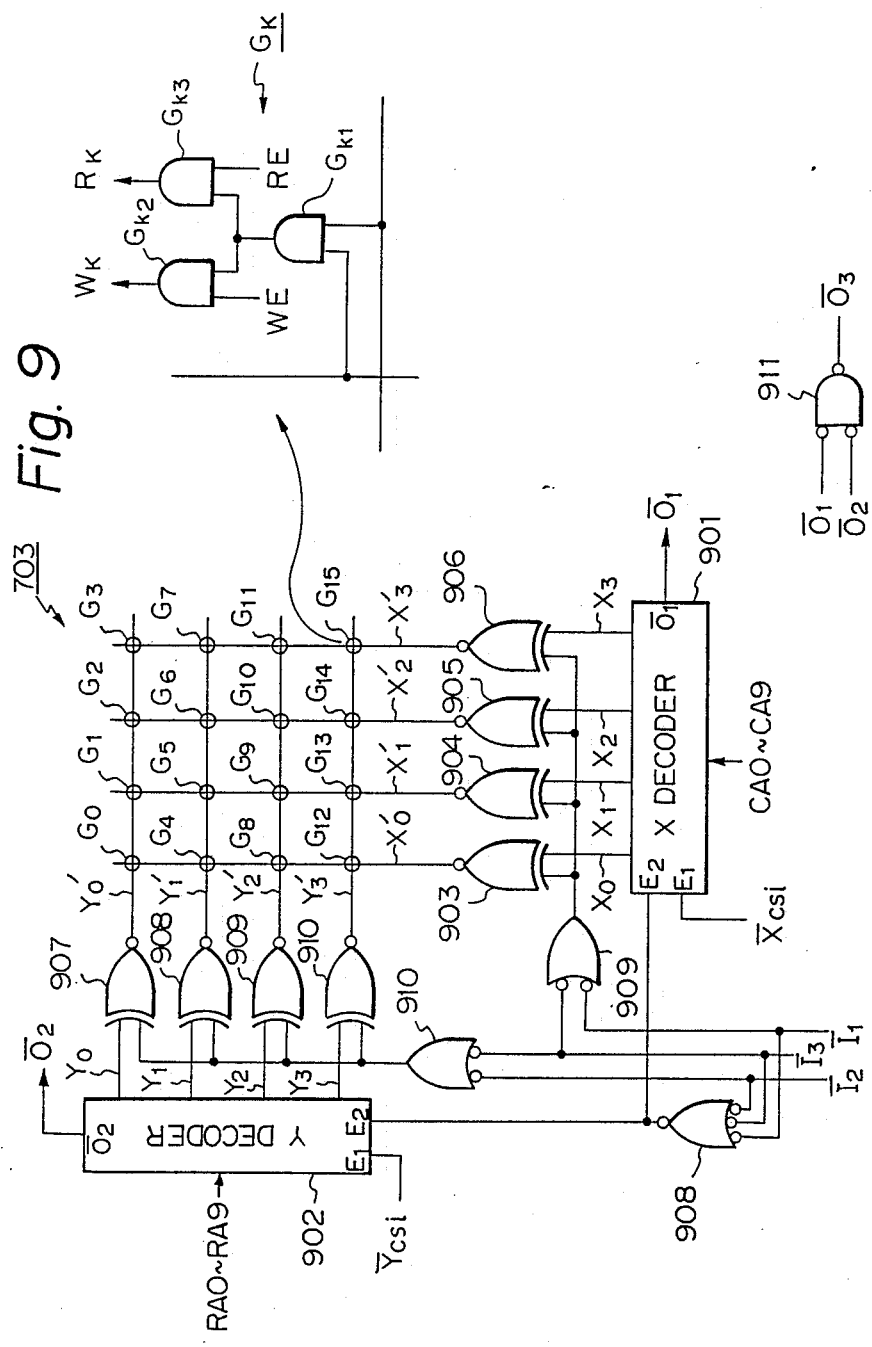
FIG. 9 is a circuit diagram of the I/O logic circuit of FIG. 7.

The bit mask signals $W_k$ and $R_k$ (k=0 to 15) are generated by the I/O logic circuit, as illustrated in FIG. 9. In FIG. 9, an X decoder 901 is activated by receiving the chip select signal $\overline{X}_{csi}$ (="0") or by receiving the signal $\overline{O}_1$, $\overline{O}_2$, or $\overline{O}_3$ at the terminal $\overline{I}_1$, $\overline{I}_2$, or $\overline{I}_3$ from the adjacent chip, thereby decoding the column address signals CA0 to CA9 as an X address. In this case, the outputs $X_0$, $X_1$, $X_2$ and $X_3$ and the signal $\overline{O}_1$, of the X decoder 901 are as shown in TABLE 1.

TABLE 1

| CA0–CAq | $X_0$ | $X_1$ | $X_2$ | $X_3$ | $\overline{O}_1$ |
|---|---|---|---|---|---|
| 3FD (HEXADECIMAL) | "1" | "1" | "1" | "0" | "0" |
| 3FE | "1" | "1" | "0" | "0" | "0" |
| 3FF | "1" | "0" | "0" | "0" | "0" |
| OTHERS | "1" | "1" | "1" | "1" | "1" |

Figure 10:
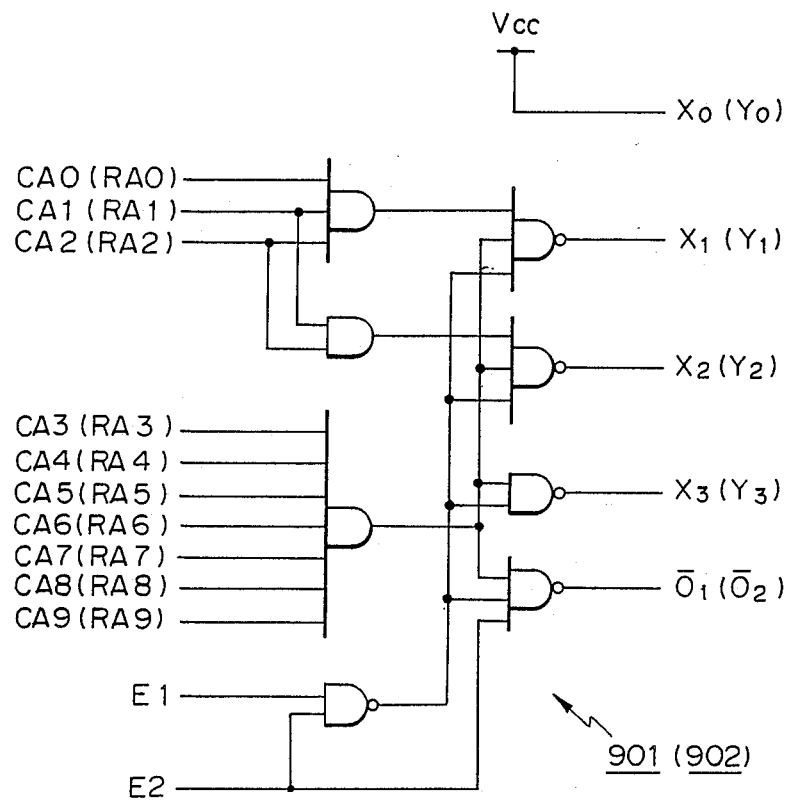
FIG. 10 is a circuit diagram of the X decoder (Y decoder) of FIG. 9.

Note that, when the signal at the terminal $\overline{I}_1$ or $\overline{I}_3$ is "0" and thus the signal at the terminal $E_2$ is made "0" by a gate circuit 908, the signal at the terminal $\overline{O}_1$ is "1". This relationship is obtained by constructing the X decoder 901 as shown in FIG. 10.

Also, when the signals at the terminals $\overline{I}_1$ and $\overline{I}_3$ are both "1", the output of a gate circuit 909 is "0" so that the outputs $X_0$ to $X_3$ of the X decoder 901 pass through exclusive OR circuits 903 to 906, and thus the outputs $X_0$ to $X_3$ of the X decoder 901 become decoding signals $X_0'$ to $X_3'$. Conversely, when the signal at the terminal $\overline{I}_1$ or $\overline{I}_3$ is "0", the outputs $X_0$ to $X_3$ of the X decoder 901 are inverted by the circuits 903 to 906 to generate the decoding signals $X_0'$ to $X_3'$.

Similarly, in FIG. 9, a Y decoder 902 is activated by receiving the chip select signal $\overline{Y}_{csi}$ (="0") or by receiving the signal $\overline{O}_1$, $\overline{O}_2$, or $\overline{O}_3$ at the terminal $\overline{I}_1$, $\overline{I}_2$, or $\overline{I}_3$ from the adjacent chip, thereby decoding the row address signals RA0 to RA9 as a Y address. In this case, the outputs $Y_0$, $Y_1$, $Y_2$, and $Y_3$ and the signal $\overline{O}_2$ of the Y decoder 902 are as shown in TABLE 2.

TABLE 2

| RA0–RAq | $Y_0$ | $Y_1$ | $Y_2$ | $Y_3$ | $\overline{O}_2$ |
|---|---|---|---|---|---|
| 3FD (HEXADECIMAL) | "1" | "1" | "1" | "0" | "0" |
| 3FE | "1" | "1" | "0" | "0" | "0" |
| 3FF | "1" | "0" | "0" | "0" | "0" |
| OTHERS | "1" | "1" | "1" | "1" | "1" |

Note that, when the signal at the terminal $\overline{I}_2$ or $\overline{I}_3$ is "0", and thus the signal at the terminal $E_2$ is made "0" by the gate circuit 908, the signal at the terminal $\overline{O}_2$ is "1". This relationship is obtained by constructing the Y decoder 902 as shown in FIG. 10.

Also, when the signals at the terminals $\overline{I}_2$ and $\overline{I}_3$ are both "1", the output of a gate circuit 910 is "0" so that the outputs Y0 to Y3 of the Y decoder 902 pass through exclusive OR circuits 907 to 910, and thus, the outputs $Y_0$ to $Y_3$ of the Y decoder 902 become decoding signals $Y_0'$ to $Y_3'$. Conversely, when the signal at the terminal $\overline{I}_2$ or $\overline{3}_3$ is "0", the outputs $Y_0$ to $Y_3$ of the Y decoder 901 are inverted by the circuits 907 to 910 to generate the decoding signals $Y_0'$ to $Y_3'$.

A gate circuit $G_k$ (k=0 to 15), at which the decoding signals $X_0'$ to $X_3'$ and $Y_0'$ to $Y_3'$ are intersected, generates a bit mask signal in accordance with these decoding signals $X_0'$ to $X_3'$ and $Y_0'$ to $Y_3'$. The gate circuit Gk is also comprised of three gate circuits $G_{k1}$, $G_{k2}$, and $G_{k3}$. The latter two gate circuits $G_{k2}$ and $G_{k3}$ receive a write enable signal WE and a read enable signal RE, respectively, from the clock generating circuit 702 and, therefore, in a write mode, a bit mask write signal $W_k$ is generated, and in a read mode, a bit mask read signal $R_k$ is generated.

Note that, only when the outputs $\overline{O}_1$ and $\overline{O}_2$ are both "0", is the output $\overline{O}_3$ of a gate circuit 911 "0", in other cases, the output $\overline{O}_3$ is "1".

An example of the operation of the circuit of FIG. 9 is explained with reference to FIGS. 11A through 11D. For example, $Y_{cs1} = Y_{cs2} = Y_{cs3} =$ "1" X address (CA0 to CA9) = 3FD (HEXADECIMAL) Y address (RA0 to RA9) = 3FE (HEXADECIMAL)

Figure 11A:
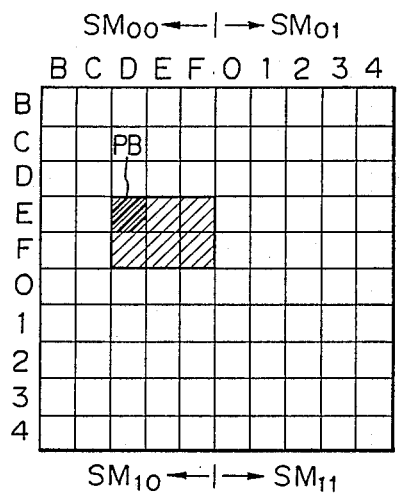
FIG. 11A through 11D are diagrams explaining the operation of the circuit of FIG. 9.

Then, in the I/O logic circuit 703 of the X decoder 901, the outputs ($X_0$, $X_1$, $X_2$, $X_3$) are (1, 1, 1, 0), and in this case, since $\overline{I}_1 = \overline{I}_3 =$ "1", the decoding signals are made ($X_0'$, $X_1'$, $X_2'$, $X_3'$) = (1, 1, 1, 0) without changing the outputs of the X decoder 901, and therefore, the selection signal $\overline{O}_1$ for the adjacent chip $SM_{01}$ to the right side is "0". On the other hand, the output of the Y decoder 902 is also ($Y_0$, $Y_1$, $Y_2$, $Y_3$) = (1, 1, 0, 0), and in this case, since $\bar{I}_2=\bar{I}_3 =$"1", the decoding signals are $(Y_0', Y_1', Y_2', Y_3') =(1, 1, 0, 0)$. Therefore, the selection signal $\bar{O}_2$ for the adjacent chip $SM_{10}$ to the under side is also "0", and the selection signal $\bar{O}_3$ for the adjacent chip $SM_{11}$ to the right and under side is also "0". Therefore, the gate circuits $G_0$, $G_1$, $G_2$, $G_4$, $G_5$, and $G_6$ are turned ON and, as a result, the shaded portions as indicated in FIG. 11A are accessed. Note that PB is a pointing bit.

Figure 11B:
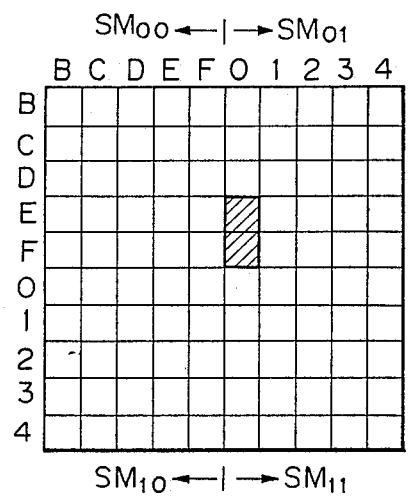

Also, in the slide access memory $SM_{01}$, although the chip selection signal $\bar{X}_{csl}$ is "1", the terminal $\bar{I}_1$ thereof receives "0" of the signal $\bar{O}_1$ from the chip $SM_{00}$ so that the X decoder 901 and the Y decoder 902 of the I/O logic circuit 703 are activated. As a result, the output of the X decoder 901 is $(X_0, X_1, X_2, X_3)=(1, 1, 1, 0)$, and in this case, since $\bar{I}_1=$"0", this output is inverted to generate the decoding signals $(X_0', X_1', X_2', X_3')=(0, 0, 0, 1)$. On the other hand, the output of the Y decoder 902 is $(Y_0, Y_1, Y_2, Y_3)=(1, 1, 0, 0)$, and in this case, since $\bar{I}_2=\bar{I}_3=$"1", the decoding signals are $(Y_0', Y_1', Y_2', Y_3')=(1, 1, 0, 0)$ without changing the output of the Y decoder 902. Therefore, the gate circuits $G_3$ and $G_7$ are turned ON, and as a result, the shaded portions indicated in FIG. 11B are accessed.

Figure 11C:
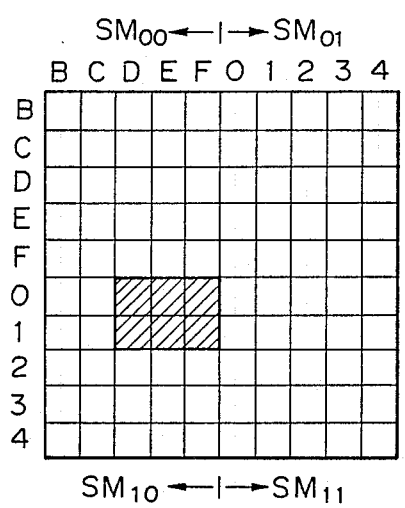

Further, in the slide access memory $SM_{10}$, although the chip selection signal $\bar{Y}_{csl}$ is "1", the terminal $\bar{I}_2$ thereof receives "0" of the signal $\bar{O}_2$ from the chip $SM_{00}$ so that the X decoder 901 and the Y decoder 902 of the I/O logic circuit 703 are activated. As a result, the output of the X decoder 901 is $(X_0, X_1, X_2, X_3) =(1, 1, 1, 0)$, and in this case, since $\bar{I}_1=\bar{I}_3=$"0", the decoding signals are $(X_0', X_1', X_2', X_3')=(1, 1, 1, 0)$ without changing the output of the X decoder 901. On the other hand, the output of the Y decoder 902 is $(Y_0, Y_1, Y_2, Y_3) =(1, 1, 0, 0)$, and in this case, since $\bar{I}_2=$"0", this output is inverted to generate the decoding signals $(Y_0', Y_1', Y_2', Y_3')=(0, 0, 1, 1)$. Therefore, the gate circuits $G_8$, $G_9$, $G_{10}$, $G_{12}$, $G_{13}$, and $G_{14}$ are turned ON, and as a result, the shaded portions indicated in FIG. 11C are accessed.

Figure 11D:
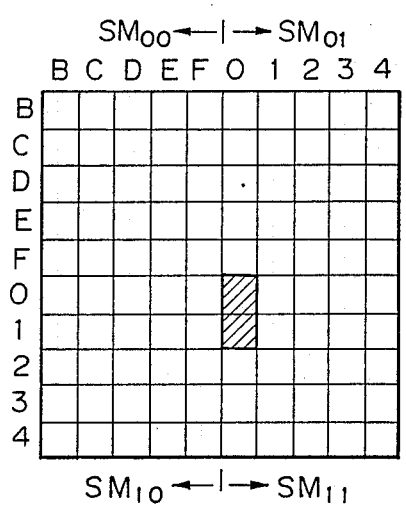

Further, in the slide access memory $SM_{11}$, although the chip selection signals $\bar{X}_{csl}$ and $\bar{Y}_{csl}$ are both "1", the terminal $\bar{I}_1$ thereof receives "0" of the signal $\bar{O}_3$ from the chip $SM_{00}$ so that the X decoder 901 and the Y decoder 902 of the I/O logic circuit 703 are activated. As a result, the output of the X decoder 901 is $(X_0, X_1, X_2, X_3)=(1, 1, 1, 0)$, and in this case, since $\bar{I}_3 =$"0", this output is inverted to generate the decoding signals $(X_0', X_1', X_2', X_3')=(0, 0, 0, 1)$. On the other hand, the output of the Y decoder 902 is $(Y_0, Y_1, Y_2, Y_3)=(1, 1, 0, 0)$, and in this case, since $\bar{I}_3 =$"1", this output is inverted to generate the decoding signals $(Y_0', Y_1', Y_2', Y_3')=(0, 0, 1, 1)$. Therefore, the gate circuits $G_{11}$ and $G_{15}$ are turned ON, and as a result, the shaded portion indicated in FIG. 11D are accessed.

In the slide access memories $SM_{01}$, $SM_{10}$, and $SM_{11}$, none of the signals $\bar{O}_1$, $\bar{O}_2$, and $\bar{O}_3$ (= "0") are generated, and as a result, the other slide access memories $SM_{02}$, $SM_{03}$, $SM_{12}$, $SM_{13}$ $SM_{20}$ to $SM_{23}$, and $SM_{30}$ to $SM_{33}$ are not accessed.

The main circuit 701 of FIG. 7 will be explained.

Figure 12A:
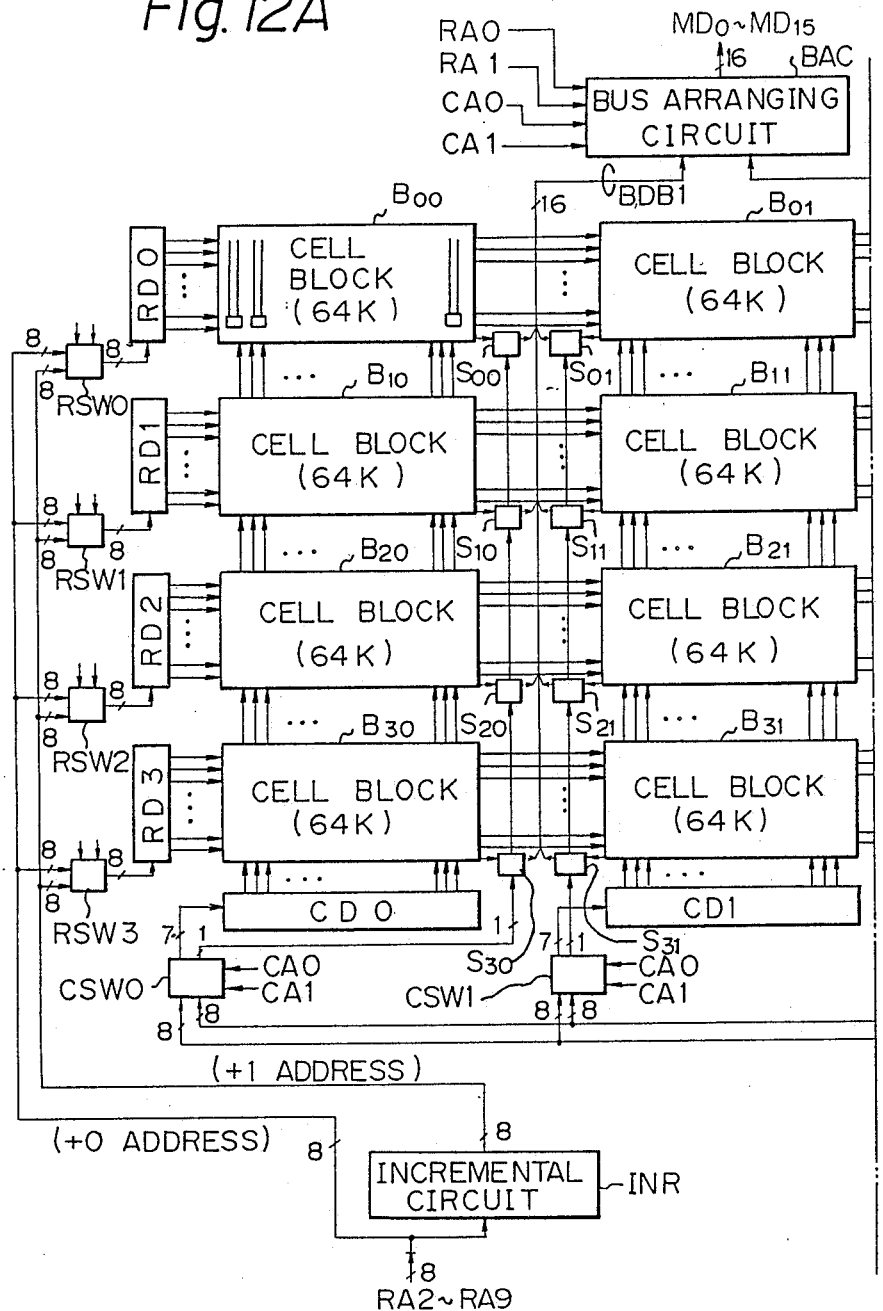
FIG. 12A and 12B is a detailed circuit diagram of the main circuit of FIG. 7.
Figure 12B:
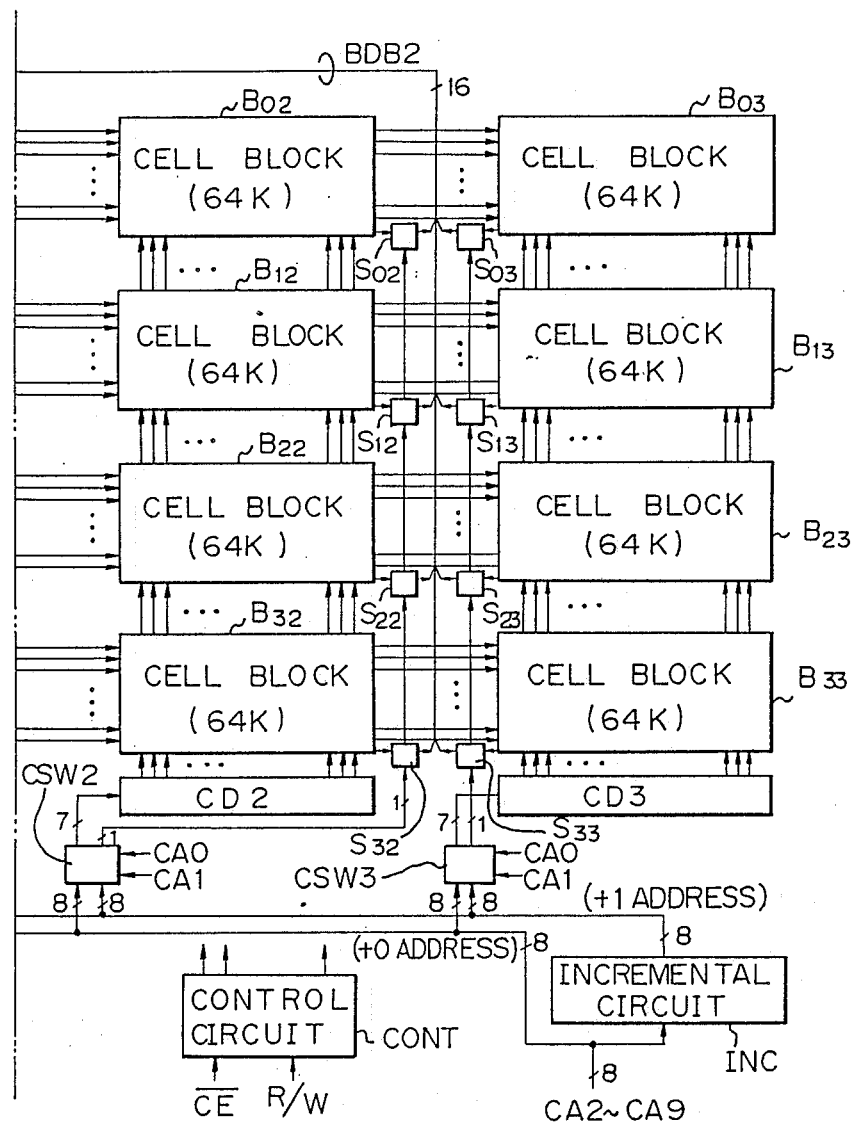
Figure 13:
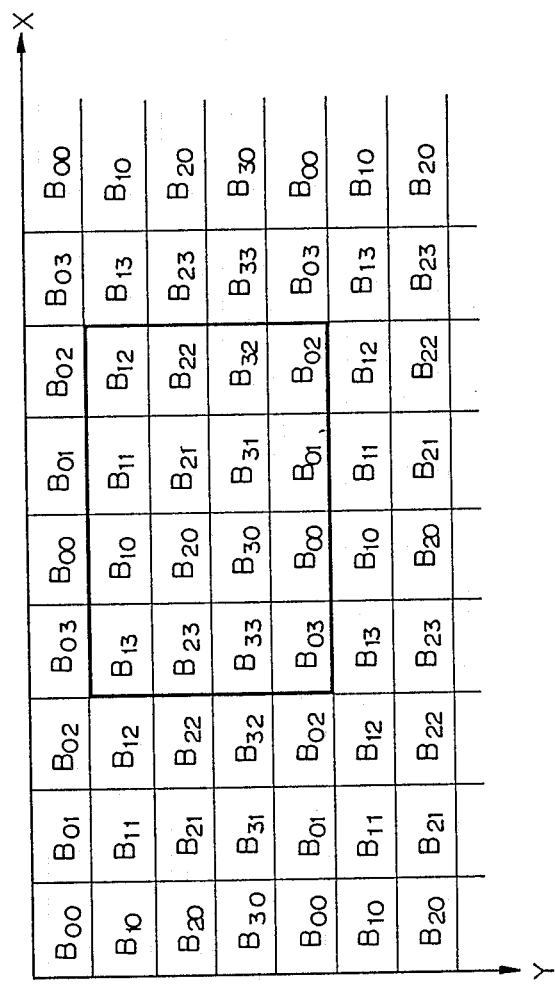
FIG. 13 is a diagram showing an allocation of a bit map to memory cell blocks in FIG. 7.

In FIG. 12, 1 M (1048576) bit memory cells are divided into 16 cell blocks $B_{00}$ $B_{01}$, ..., and $B_{33}$, i.e., each of the cell blocks $B_{00}$ $B_{01}$, ..., and $B_{33}$ is 64 K (65536) bits. At this point, the bit map (see FIG. 1) of the memory cells is allocated to the blocks as illustrated in FIG. 13.

A row decoder RD0 is provided commonly for the four cell blocks $B_{00}$, $B_{01}$, $B_{02}$, and $B_{03}$; a row decoder RD1 is provided commonly for the four cell blocks $B_{10}$, $B_{11}$, $B_{12}$, and $B_{13}$; a row decoder RD2 is provided commonly for the four cell blocks $B_{20}$, $B_{21}$, $B_{22}$, and $B_{23}$; and a row decoder RD3 is provided commonly for the four cell blocks $B_{30}$, $B_{31}$, $B_{32}$, and $B_{33}$. These row decoders RD0 to RD3 have the same configuration. On the other hand, a column decoder CD0 is provided commonly for the four cell blocks $B_{00}$, $B_{10}$, $B_{20}$, and $B_{30}$; a column decoder CD1 is provided commonly for the four cell blocks $B_{01}$, $B_{11}$, $B_{21}$, and $B_{31}$; a column decoder CD2 is provided commonly for the four cell blocks $B_{02}$, $B_{12}$, $B_{22}$, and $B_{32}$; and a column decoder CD3 is provided commonly for the four cell blocks $B_{03}$, $B_{13}$, $B_{23}$, and $B_{33}$. These column decoders CD0 to CD3 also have the same configuration.

Among the ten-bit row address signals RA0 to RA9, the upper 8 bits RA2 to RA9 are incremented by +1 (decimal denotation) by an incrementer circuit INR, and as a result, two addresses, i.e., +0 address (through state) and +1 address (incremental state) are supplied to row-side switches RSW0 to RSW3. The row-side switches RSW0 to RSW3 switch the +0 address and the +1 address in accordance with the lower two bits RA0 and RA1 of the ten-bit row address signals, and supply them to the row decoder RD0 to RD3. On the other hand, among the ten-bit column address signals CA0 to CA9, the upper 8 bits CA2 to CA9 are incremented by +1 (decimal denotation) by an incremental circuit INC, and as a result, two addresses, i.e., +0 address (through state) and +1 address (incremental state) are supplied to column-side switches CSW0 to CSW3. The column-side switches CSW0 to CSW3 switch the +0 address and the +1 address in accordance with the lower two bits CA0 and CA1 of the ten-bit row address signals, and supply them to the column decoders CD0 to CD3. In this case, as will be explained later, since two bit lines are selected in each of the cell blocks, one-bit outputs of the column-side switches CSW0 to CSW3 are transmitted to selectors $S_{00}$, $S_{10}$, $S_{20}$, and $S_{30}$; ... ; $S_{30}$, $S_{31}$, $S_{32}$, and $S_{33}$.

The sixteen selectors $S_{00}$, $S_{10}$, $S_{20}$, and $S_{30}$; ... ; $S_{30}$, $S_{31}$, $S_{32}$, and $S_{33}$ are connected by block data buses BDB1 and BDB2 to a bus arranging circuit BAC1. Note that the bus BDB1 includes sixteen lines for signals $BDB_{00}$ to $BDB_{03}$, $BDB_{10}$ to $BDB_{13}$, and their inverted signals, and the bus BDB 2 includes sixteen lines for signals $BDB_{20}$, to $BDB_{23}$, $BDB_{30}$ to $BDB_{33}$, and their inverted signals. The bus arranging circuit BAC1 controls the connections between the selector $S_{00}$ to $S_{33}$ and input/output terminals $MD_0$ to $MD_{15}$ in accordance with the lower bits RA0, RA1, CA0 and CA1.

Also, a control circuit CONT controls various portions in accordance with a chip enable $\overline{CE}$, a read/write signal R/W, and the like, from the clock generating circuit 702 of FIG. 7.

Figure 14:
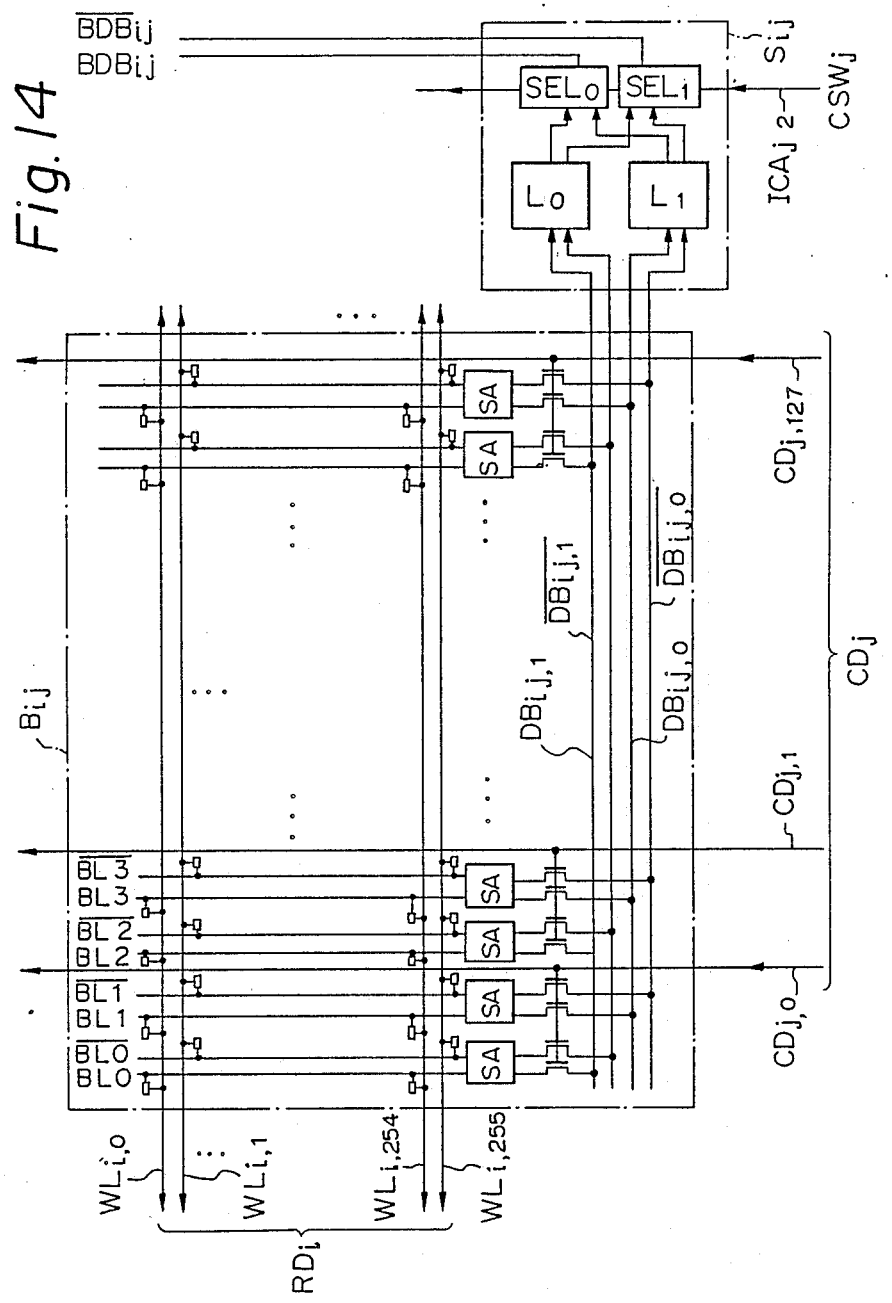
FIG. 14 is a detailed circuit diagram of the cell block of FIG. 12.
Figure 15:
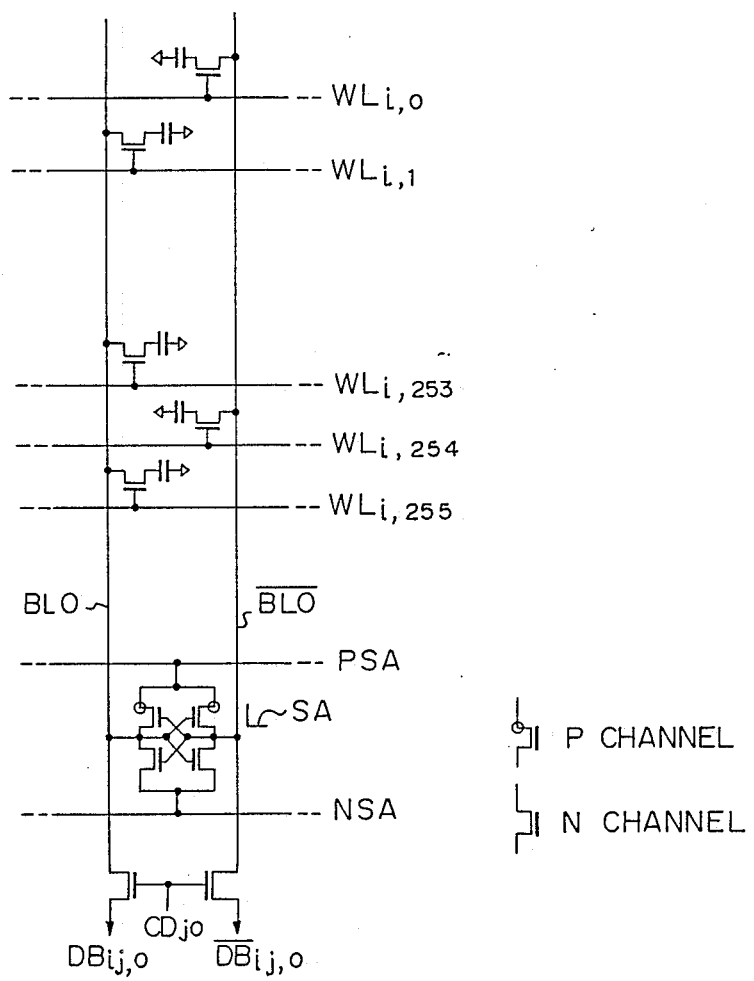
FIG. 15 partial detailed diagram of FIG. 14.

In FIG. 14, which is a detailed circuit diagram of the cell block $B_{ij}$ of FIG. 12, folded bit lines are used. That is, as illustrated in FIG. 15 memory cells are provided at every other intersection of a pair of bit lines and word lines on one side of each sense amplifier SA. Note that the sense amplifier SA of FIG. 15 is comprised of P-channel transistors between a line PSA and bit lines BL0 and $\overline{BL0}$, and N-channel transistors between a line NSA and bit lines BL0 and $\overline{BL0}$ and when the lines PSA and NSA are made high and low, respectively, the sense amplifier SA is operated. Also, in FIG. 14, the row decoder $RD_i$ selects one word line from 256 word lines $WL_{i,0}, WL_{i,1}, \ldots,$ and $WL_{i,255}$, while the column decoder $CD_j$ selects two pairs of bit lines such as BL0 and $\overline{BL0}$; and BL1 and $\overline{BL1}$ by the column selection signals $CD_{j,0}, CD_{j,1}, \ldots,$ and $CD_{j,127}$ thereof, and connects them to data buses $DB_{ij,0}$ and $\overline{DB_{ij,0}}$; $DB_{ij,1}$ and $\overline{DB_{ij,1}}$ within the block, and further, one pair of the two pairs of the data buses $DB_{ij,0}$ and $\overline{DB_{ij,0}}$; $DB_{ij,1}$ and $\overline{DB_{ij,1}}$ within the block is selected by a switch $S_{ij}$ and is connected to block data buses $BDB_{ij}$ and $\overline{BDB_{ij}}$.

Figure 16:
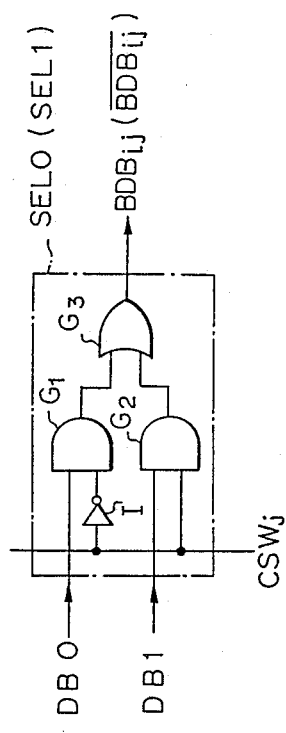
FIG. 16 detailed circuit diagram of the selector of FIG. 14.

The switch $S_{ij}$ is comprised of two data bus latches L0 and L1 and two selectors SEL0 and SEL1. As illustrated in FIG. 16, each of the selectors is comprised of an inverter I, AND circuits G1 and G2, and an OR circuit G3. That is, in accordance with a bit $CSW_j$ of a column address, one of the data bus latches L0 and L1 is connected to the block data buses $BDB_{ij}$ and $\overline{BDB_{ij}}$.

According to the configuration of the cell block $B_{ij}$ as shown in FIG. 14, since each of the column decoders $CD_j$ has a 128-bit configuration, this contributes to a reduction of the column decoders, which is helpful in maintaining a large capacity and high integration of a device. Note, in the present invention, such a cell block configuration is only one example, and the present invention can be applied to an open bit line type. Also, each of the column decoders $CD_j$ is constructed to be able to directly select one bit line pair from 256 pairs of bit lines. In this case, all of the 8 bit addresses from the column-side switches CSW0 to CSW3 are supplied to all of the respective column decoders $CD_j$, and the switch $S_{ij}$ is deleted.

In FIG. 12, when a 4×4 bit group (see FIG. 1) as indicated by a thick line frame in FIG. 13 is accessed, in order to locate the pointing bit in a left and upper edge point, the X coordinate of the bit map is
(CA9, CA8, ..., CA0)=(0000000011)

Also, the Y coordinate of the bit map is (RA9, RA8, ..., RA0)=(0000000001)

These coordinates are supplied from the exterior. That is, if the upper 16 bits (RA9 to RA2, CA9 to CA2) of an address given to each of the cell blocks are the same, a boundary-free 4×4 bit group indicated by a thick line frame in FIG. 13 is present in a logic plane. At this time, in order to always access four bits having X coordinate values (column) larger than that of the pointing bit PB and four bits having Y coordinate (row) values larger than that of the pointing bit PB, the upper 16 bits input to the row decoders RD0 to RD3 and the column decoders CD0 to CD3 are switched by the cases of +0 (through state) or +1 (incremental state). Thus, the address boundary indicated by a thick line in FIG. 13 is erased.

In each cell block $B_{ij}$, the above-mentioned switching of the cases of +0 (through) and +1 (through) must be carried out, but since one row decoder such as RD0 is provided commonly for four cell blocks such as $B_{00}$, $B_{01}$ $B_{02}$, and $B_{03}$ for one row, and one column decoder such as CD0 is provided commonly for cell blocks such as $B_{00}$, $B_{10}$, $B_{20}$, and $B_{30}$, only eight switches are provided, i.e., the row-side switches RSW0 to RSW3 and the column-side switches CSW0 to CSW3.

Figure 17:
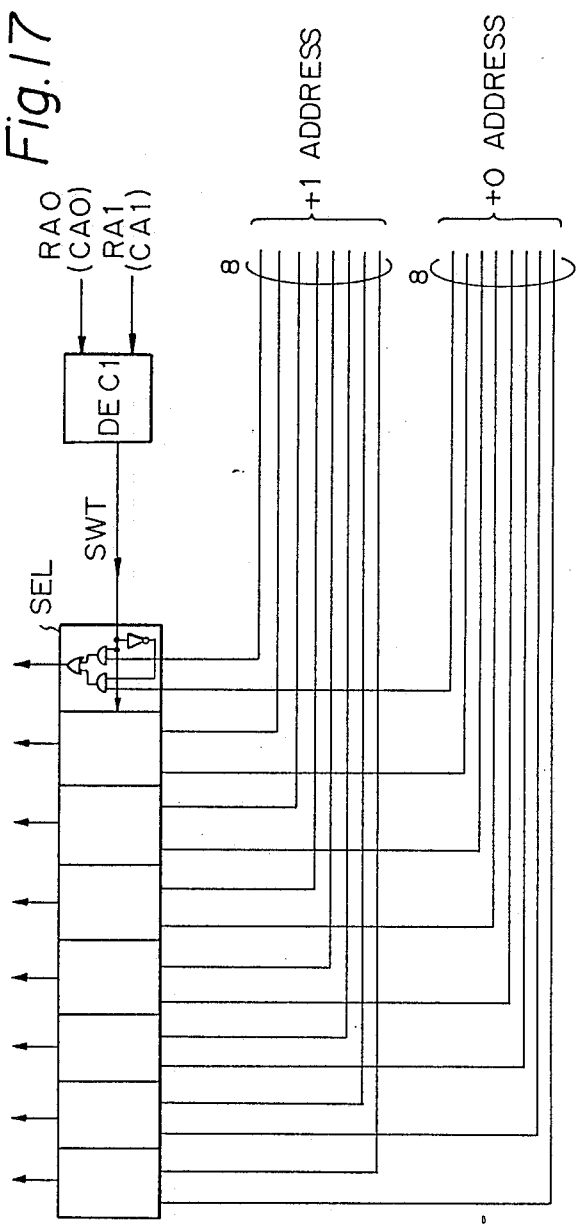
FIG. 17 is a detailed circuit diagram of the row-side switch (column-side switch) of FIG. 12.

As illustrated in FIG. 17, each of the switches RSW0 to RSW3 (or CSW0 to CSW3) is comprises of a decoder DEC1 for decoding the lower two bits RA0 and RA1 of a row address (or CA0 and CA1 of a column address), and an 8 bit selector SEL which operates in accordance with the output SWT of the decoder DEC1. Here, the decoding logic of the decoder DEC1 is dependent on each of the switches, and the circuit thereof satisfies the logic equation indicated in TABLE 3.

TABLE 3

| SWITCH | SWT |
|---|---|
| RSW0 | (RA0) + (RA1) |
| RSW1 | (RA1) |
| RSW2 | (RA0) · (RA1) |
| RSW3 | 0 |
| CSW0 | (CA0) + (CA1) |
| CSW1 | (CA1) |
| CSW2 | (CA0) · (CA1) |
| CSW3 | 0 |

In TABLE 3, "+" shows "OR", and "·" shows "AND".

Note that, since a bit group has the same width on the row side as on the column side, the logic equations of the row-side switches are the same as those of the column-side switches. Nevertheless, if a bit group is comprised of 2×8 bits, 3×5 bits, ..., so that the width in the row direction is different from the width in the column direction, the logic equations of the row-side switches are naturally different from those of the column-side switches.

The logic conditions of TABLE 4 are explained with reference to FIG. 18. In FIG. 18, which is a diagram showing a row address boundary, three thick lines in the traverse direction indicate row boundaries by the upper 8 bits RA9 to RA2. Here, the four blocks $B_{0j}$, $B_{1j}$, $B_{2j}$, and $B_{3j}$ have a difference in the lower two bits on the Y coordinate (row) of the bit map plane. As 4×4 bit groups are accessed, there are four kinds of cases I, II, III, and IV. In case I, since the bit group does not cross the row address boundary, the same external addresses RA9 to RA2 are supplied to the cell blocks $B_{0j}$, $B_{1j}$, $B_{2j}$, and $B_{3j}$ without change (through state); in case II, the row address only for the cell block $B_{0j}$ is incremented by +1; in case III, the row addresses for the cell blocks $B_{0j}$ and $B_{1j}$ are incremented by +1; and in case IV, the row addresses for the cell blocks $B_{0j}$, $B_{1j}$, and $B_{2j}$ are incremented by +1. In summary, TABLE 4 is obtained as shown below.

TABLE 4

| CASE | (RA1, RA0) | $B_{3j}$ | $B_{2j}$ | $B_{1j}$ | $B_{0j}$ |
|---|---|---|---|---|---|
| I | (0, 0) | +0 | +0 | +0 | +0 |
| II | (0, 1) | +0 | +0 | +0 | +1 |
| III | (1, 0) | +0 | +0 | +1 | +1 |
| IV | (1, 1) | +0 | +1 | +1 | +1 |

TABLE 4 is transformed into logic equations by the lower two bits RA1 and RA0 indicating the pointing bit position, thus obtaining TABLE 3.

Note that the same holds true for the column address side.

Accordingly, a boundary-free 4×4 bit group can be accessed, for example, can be read from the bit map, but when data is transmitted to interval input/output terminals $MD_0$ $MD_{15}$, this is disadvantageous to the peripheral processing of video data. For example, when a 4×4 bit group corresponding to a block as illustrated in FIG. 19A is read without arrangement, the relationship between the pointing bit (PB) and the other peripheral bits on the bit map is not a logic relationship, as illustrated in FIG. 19B. In practice, an arrangement of the input/output terminals as illustrated in FIG. 19C is desired. That is, 1) the pointing bit PB is always accessed at the internal input/output terminal $MD_0$;

2) the four bits located by sequentially incrementing the pointing bit PB in the X direction are sequentially accessed at the internal input/output terminals $MD_0$, $MD_1$, $MD_2$, and $MD_3$; and 3) the Y direction is then incremented and the four bits located by incrementing the X direction are sequentially accessed at the internal input/output terminals $MD_4$, $MD_5$, $MD_6$, and $MD_7$.

Figure 20:
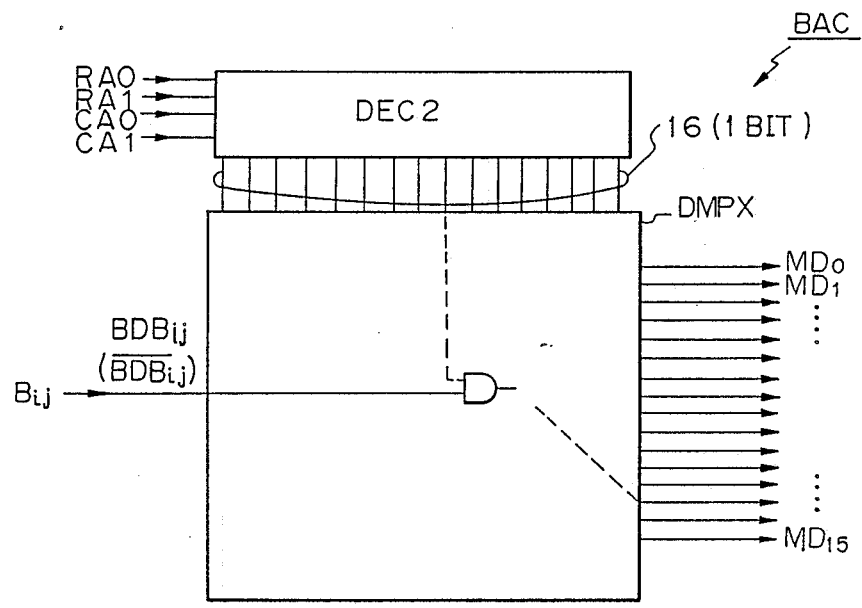
FIG. 20 is a circuit diagram of the bus arranging circuit of FIG. 12.
Figure 21:
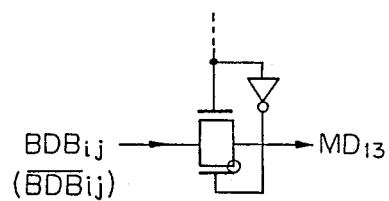
FIG. 21 is a partial circuit diagram of FIG. 20.
Figure 26:
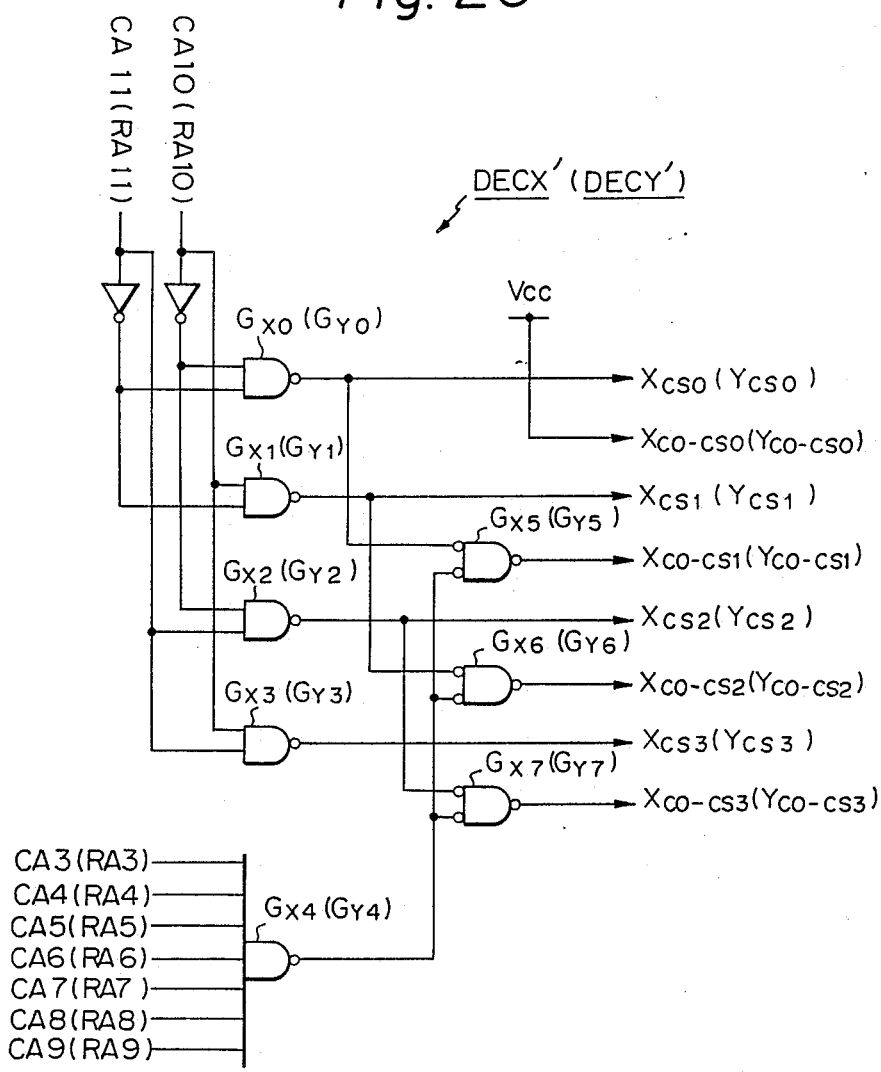
FIG. 26 is a circuit diagram of the X decoder (Y decoder) of FIG. 25.

In order to always access a 4×4 bit group as illustrated in FIG. 19C from the bit map, regardless of an address of the pointing bit PB, a bus arranging circuit BAC is provided. As illustrated in FIG. 20, the bus arranging circuit BAC is comprised of a demultiplexer circuit DMPX (actually, 16 demultiplexers) which connects the block data bus $BDB_{ij}$ ($\overline{BDB}_{ij}$), connected to the cell block $B_{ij}$, to one of the input/output terminals $MD_0$ to $MD_{15}$, and a decoder DEC2 for controlling the demultiplexers of the demultiplexer circuit DMPX. In this case, the decoder DEC2 controls the demultiplexer circuit DMPX in accordance with the lower 4 bits RA1, RA0, CA1, and CA0 of a row address and a column address. Note that an AND circuit within the demultiplexer circuit DMPX is constructed by a complementary metal oxide semiconductor (CMOS) switch as illustrated in FIG. 21. Accordingly, the bus arranging circuit BAC connects the bus block $B_{ij}$ to the internal input/output terminal $MD_k$ as indicated in TABLE 5.

such as $SM_{01}$, $SM_{10}$, or $SM_{11}$, adjacent to the slide access memory $SM_{00}$, auxiliary chip selection signals $\overline{X}_{c0-cs0}$ to $\overline{X}_{c0-cs3}$ from the X decoder DECX' and auxiliary chip selection signals $\overline{Y}_{c0-cs0}$ to e,ovs/Y/ $_{c0-cs3}$ from a Y decoder DECY' carry out an access request. Therefore, the terminals $\overline{O}_1$ to $\overline{O}_3$ and $\overline{I}_1$ to $\overline{I}_3$ of FIG. 6 are not provided in each of the slide access memories $SM_{00}$ to $SM_{33}$, but instead, the logic circuits of the X decoder DECX' and the Y decoder DECY' become complex, compared with the X decoder DECX and the Y decoder DECY of FIG. 4 (or FIG. 6). That is, as illustrated in FIG. 26, gate circuits $G_{X4}$, $G_{X5}$, $G_{X6}$, and $G_{X7}$ ($G_{Y4}$, $G_{Y5}$, $G_{Y6}$, and $G_{Y7}$) are added to the elements of the X decoder DECX (the Y decoder DECY).

Figure 23:
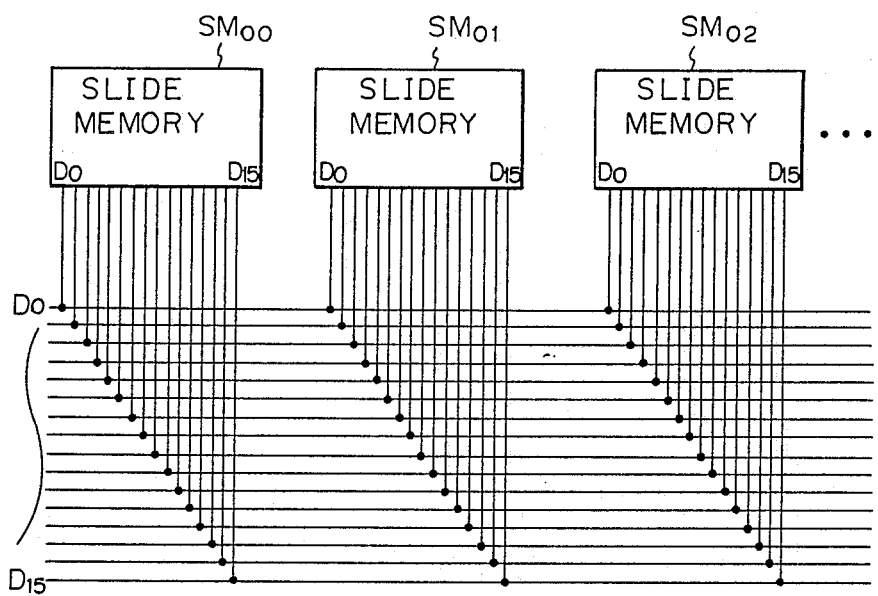
FIG. 23 is a circuit diagram of the output portion of FIG. 6.
Figure 25:
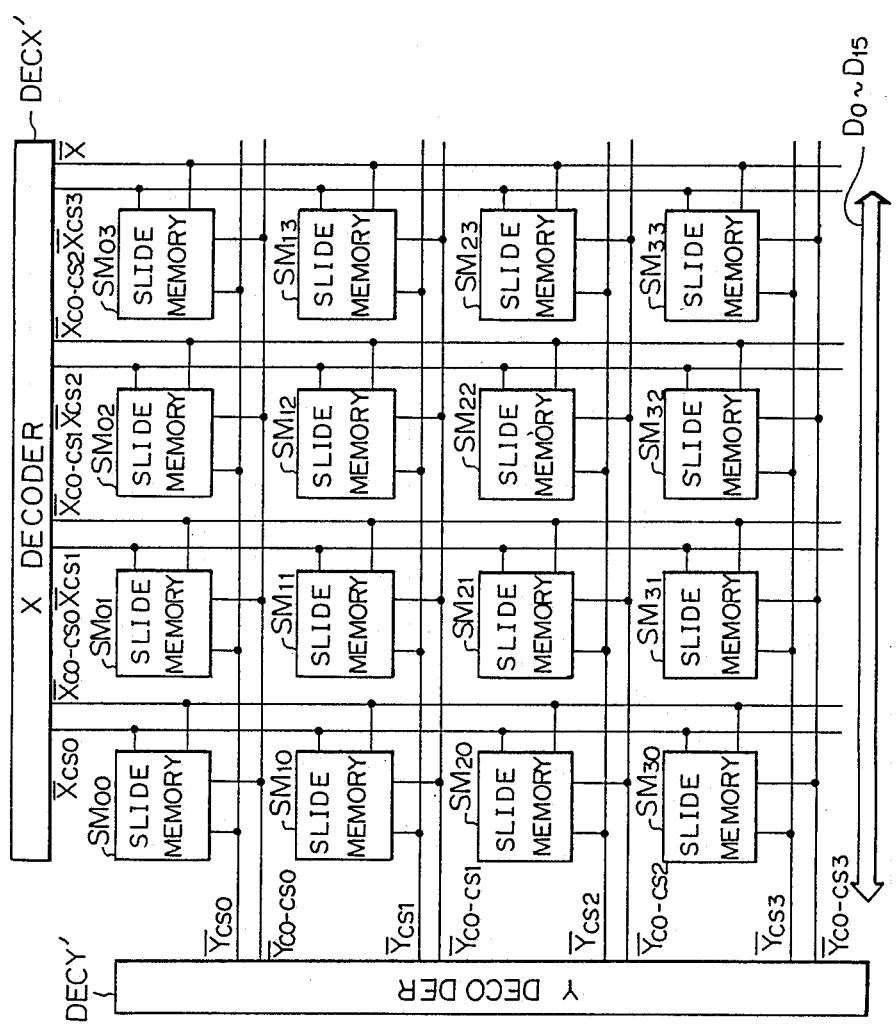
FIG. 25 is a block circuit diagram illustrating a second embodiment of the boundary-free semiconductor memory device according to the present invention.
Figure 27:
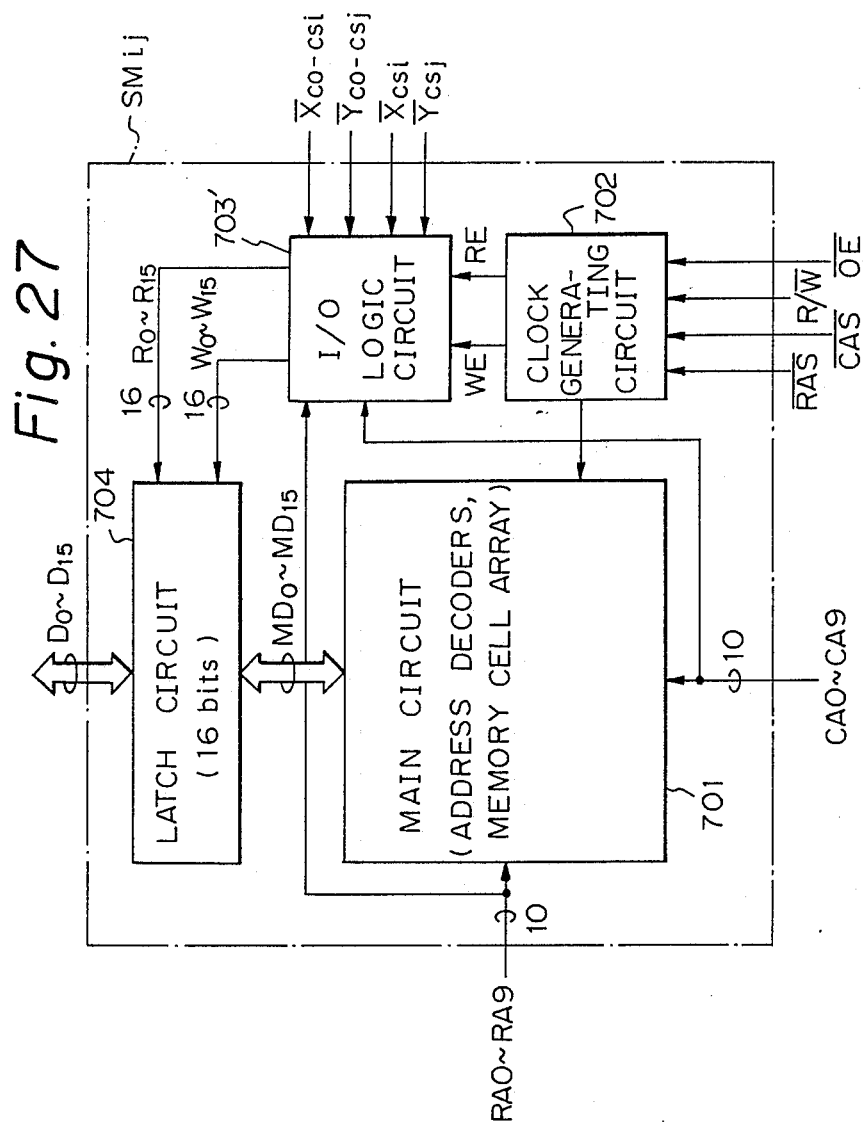
FIG. 27 is a block diagram of the slide access memory device (chip) of FIG. 25.
Figure 28:
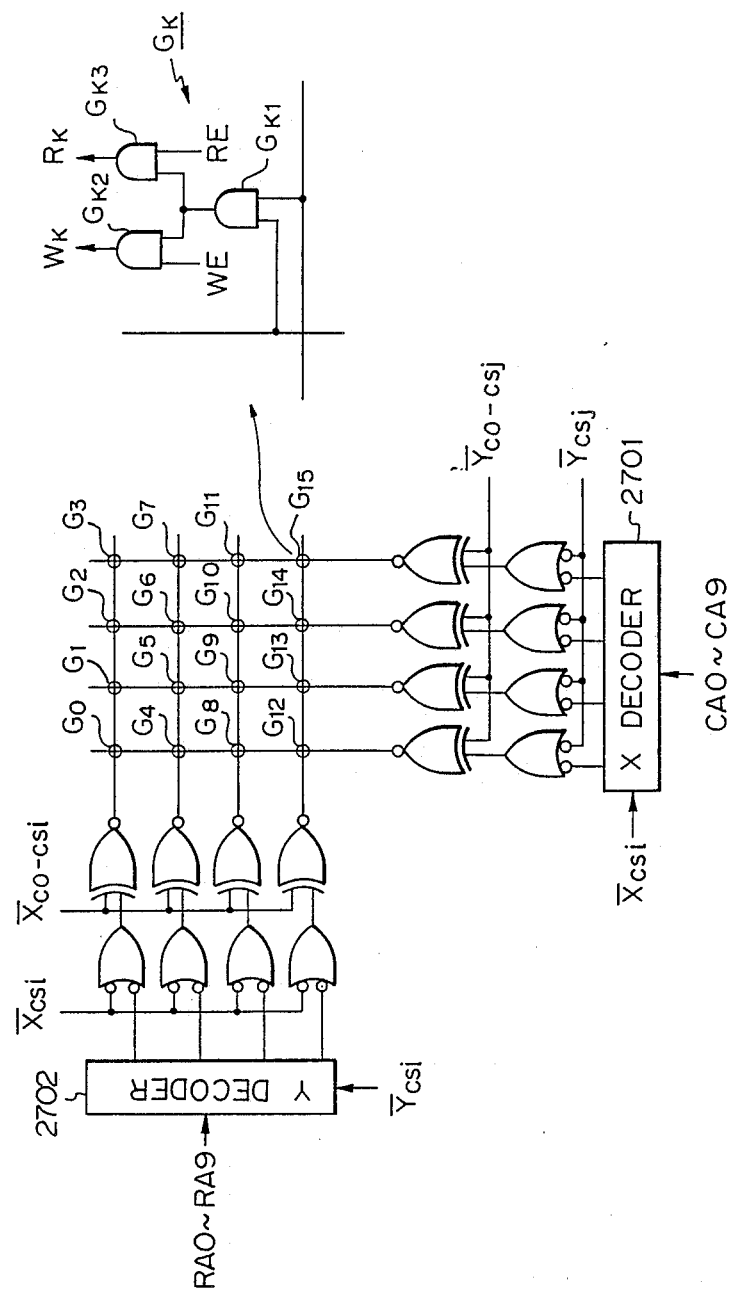
FIG. 28 is a circuit diagram of the I/O logic circuit of FIG. 27.
Figure 29:
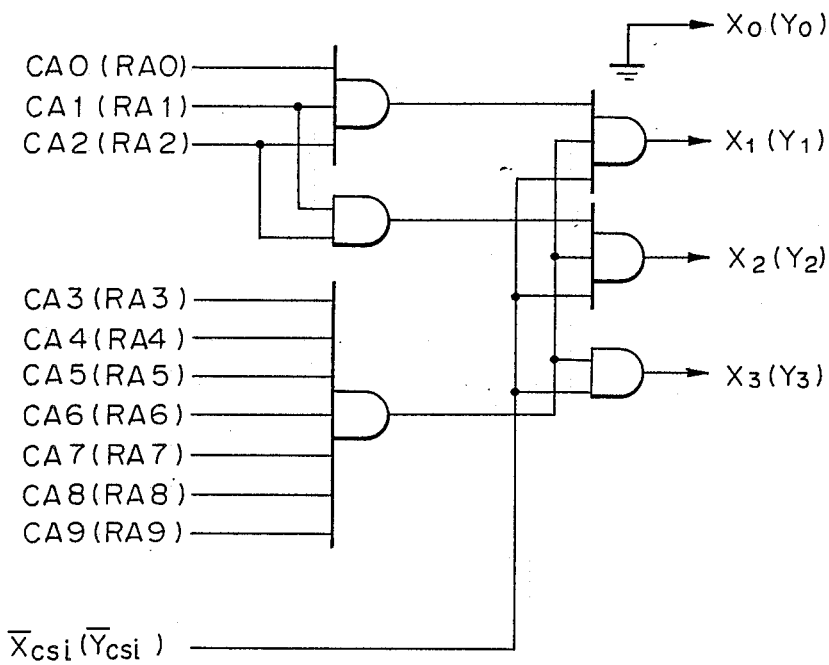
FIG. 29 is a circuit diagram of the X decoder (Y decoder) of FIG. 28.

In FIG. 27, which is a block circuit diagram of the slide access memory $SM_{ij}$ of FIG. 25, the I/O logic circuit 703' is different from the I/O logic circuit 703 of FIG. 7. Namely, the I/O logic circuit 703' is simplified when compared with the I/O logic circuit 703 of FIG. 9, as illustrated in FIG. 23, since the gate circuits 908, 909, 910 of FIG. 9 become unnecessary. Also, an X decoder 2701 and a Y decoder 2702 are simplified when compared with the X decoder 901 and the Y decoder 902 of FIG. 9, as illustrated in FIG. 29, since the generation of the chip selection signals $\overline{O}_1$, $\overline{O}_2$, and $\overline{O}_3$ become unnecessary.

Since the operation of the second embodiment is very similar to that of the first embodiment, the description thereof is omitted.

In the above-mentioned first embodiment, as illustrated in FIG. 22A, the pointing bit PB is located at a

TABLE 5

| | CA0 | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|---|
| | CA1' | 0' | 0' | 1' | 1' | 0' | 0' | 1' | 1' | 0' | 0' | 1' | 1' | 0' | 0' | 1' | 1' |
| | RA0' | 0' | 0' | 0' | 0' | 1' | 1' | 1' | 1' | 0' | 0' | 0' | 0' | 1' | 1' | 1' | 1' |
| $B_{ij}$ | RA1' | 0' | 0' | 0' | 0' | 0' | 0' | 1' | 1' | 1' | 1' | 1' | 1' | 1' | 1' | 1' | 1' |
| $B_{00}$ | | 0 | 3 | 2 | 1 | 12 | 15 | 14 | 13 | 8 | 11 | 10 | 9 | 4 | 7 | 6 | 5 |
| $B_{01}$ | | 1 | 0 | 3 | 2 | 13 | 12 | 15 | 14 | 9 | 8 | 11 | 10 | 5 | 4 | 7 | 6 |
| $B_{02}$ | | 2 | 1 | 0 | 3 | 14 | 13 | 12 | 15 | 10 | 9 | 8 | 11 | 6 | 5 | 4 | 7 |
| $B_{03}$ | | 3 | 2 | 1 | 0 | 15 | 14 | 13 | 12 | 11 | 10 | 9 | 8 | 7 | 6 | 5 | 4 |
| $B_{10}$ | | 4 | 7 | 6 | 5 | 0 | 3 | 2 | 1 | 12 | 15 | 14 | 13 | 8 | 11 | 10 | 9 |
| $B_{11}$ | | 5 | 4 | 7 | 6 | 1 | 0 | 3 | 2 | 13 | 12 | 15 | 14 | 9 | 8 | 11 | 10 |
| $B_{12}$ | | 6 | 5 | 4 | 7 | 2 | 1 | 0 | 3 | 14 | 13 | 12 | 15 | 10 | 9 | 8 | 11 |
| $B_{13}$ | | 7 | 6 | 5 | 4 | 3 | 2 | 1 | 0 | 15 | 14 | 13 | 12 | 11 | 10 | 9 | 8 |
| $B_{20}$ | | 8 | 11 | 10 | 9 | 4 | 7 | 6 | 5 | 0 | 3 | 2 | 1 | 12 | 15 | 14 | 13 |
| $B_{21}$ | | 9 | 8 | 11 | 10 | 5 | 4 | 7 | 6 | 1 | 0 | 3 | 2 | 13 | 12 | 15 | 14 |
| $B_{22}$ | | 10 | 9 | 8 | 11 | 6 | 5 | 4 | 7 | 2 | 1 | 0 | 3 | 14 | 13 | 12 | 15 |
| $B_{23}$ | | 11 | 10 | 9 | 8 | 7 | 6 | 5 | 4 | 3 | 2 | 1 | 0 | 15 | 14 | 13 | 12 |
| $B_{30}$ | | 12 | 15 | 14 | 13 | 8 | 11 | 10 | 9 | 4 | 7 | 6 | 5 | 0 | 3 | 2 | 1 |
| $B_{31}$ | | 13 | 12 | 15 | 14 | 9 | 8 | 11 | 10 | 5 | 4 | 7 | 6 | 1 | 0 | 3 | 2 |
| $B_{32}$ | | 14 | 13 | 12 | 15 | 10 | 9 | 8 | 11 | 6 | 5 | 4 | 7 | 2 | 1 | 0 | 3 |
| $B_{33}$ | | 15 | 14 | 13 | 12 | 11 | 10 | 9 | 8 | 7 | 6 | 5 | 4 | 3 | 2 | 1 | 0 |

Note that the numerals in TABLE 5 indicate the number of the internal input/output terminal MD. For example, "14" indicates $MD_{14}$.

Figure 24:
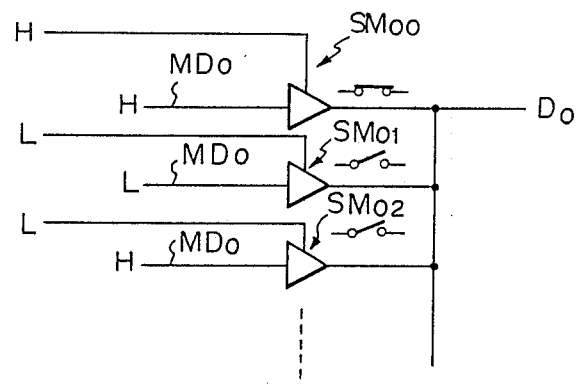
FIG. 24 is a circuit diagram showing one bit of the circuit of FIG. 23.

In FIG. 23, which is a circuit diagram showing the output portion of FIG. 6, as explained above, the input/output data lines $D_0$ to $D_{15}$ are provided commonly for the slide access memories $SM_{00}$, $SM_{01}$, $SM_{02}$, ..., and $SM_{33}$, but the input/output data line such as $D_0$ is connected to only one of the slide access memories $SM_{00}$ to $SM_{33}$. For example, in a read mode, as illustrated in FIG. 24, when the read buffer $RB_0$ of the slide access memory $SM_{01}$ is turned ON, the read buffers $RB_0$ corresponding to the internal input/output data line $MD_0$ of the other slide access memories $SM_{00}$ to $S_{02}$, ... are in a high impedance state.

In FIG. 25, which illustrates a second embodiment of the present invention realizing the principle of FIG. 5, when it is necessary to access the slide access memories left and upper position of the bit group, but it is possible to change the pointing bit PB as illustrated in FIG. 22B.

Note that, in the above-mentioned embodiment, although the bit map is given by a plane (two-dimensions X and Y), the present invention can be extended for a space (three-dimensions X, Y, and Z) by using a similar hierarchy technique.

As explained above, according to the extended slide access memory system of the present invention, the number of connection and the number of elements needed for the extension of the slide access memory system can be decreased, thus reducing the size of the entire system.

We claim:

1. A semiconductor memory device comprising:

a plurality of slide access memories (SM$_{00}$, SM$_{01}$, ..., and SM$_{n-1, m-1}$) incorporating input/output portions (704), in which a group of bits can be accessed;

data liners (D$_0$, D$_1$, ..., D$_{15}$) commonly connected to the input/output portions of each of said slide access memories;

a first access means for accessing a same rectangular group of bits from each of said slide access memories to interconnect said groups of bits to corresponding input/output portions incorporated in said slide access memories;

a second access means for selecting each bit of the input/output portions to enable or disable operation of said selected input/output portions, to connect the rectangular groups of bits including a special bit (PB) to said data lines, wherein said second access means comprises:

decoder means (DECX, DECY) for generating a selection signal ($\overline{X}_{csi}, \overline{Y}_{csj}$) to select one of said slide access memories; and logic means (703), provided in each of said slide access memories, for receiving said selection signal ($\overline{X}_{csi}, \overline{Y}_{csj}$) from said decoder means;

said logic means of one slide access memory selected by said decoder means receiving the same row and column addresses to generate access request signals (O$_1$, O$_2$, O$_3$) to other slide access memories adjacent to said selected slide access memory.

2. A device as set forth in claim 1, wherein each of said slide access memories comprises:

a plurality of memory cell blocks (B$_{00}$ to B$_{33}$);

row selecting means (RD0 to RD3) provided for each row of said memory cell blocks respectively;

column selecting means (CD0 to CD3) provided for each column of said memory cell blocks respectively;

a first switching means (RSW), connected to said row selecting means, for supplying a row address (A$_R$) or a row address (A$_R$+1) adjacent to said row address to each of said row selecting means;

a second switching means (CSW), connected to said column selecting means, for supplying a column address (A$_C$) or a column address (A$_C$+1) adjacent to said column address to each of said column selecting means;

a rearranging means (BAC), connected to said memory cell blocks, for rearranging cells of said memory cell blocks selected by said row selecting means and said column selecting means, to interconnect the rearranged cells (MD$_0$ to MD$_{15}$) to corresponding input/output portions.

3. A device as set forth in claim 1, wherein said first access means comprises means for supplying the same row and column addresses (RA0 to RA9, CA0 to CA9) to all of said slide access memories.

4. A semiconductor memory device comprising:

a plurality of slide access memories (SM$_{00}$, SM$_{01}$, ..., and SM$_{n-1, m-1}$) incorporating input/output portions (704), in which a group of bits can be accessed;

data lines (D$_0$, D$_1$, ..., D$_{15}$) commonly connected to the input/output portions of each of said slide access memories;

a first access means for accessing a same rectangular group of bits from each of said slide access memories to interconnect said groups of bits to corresponding input/output portions incorporated in said slide access memories;

a second access means for selecting each bit of the input/output portions to enable or disable operation of said selected input/output portions, to connect the rectangular groups of bits including a special bit (PB) to said data lines, wherein said second access means comprises:

decoder means (DECX', DECY') for generating a selection signal ($\overline{X}_{csi}, \overline{Y}_{csj}$) to select one of said slide access memories and generating auxiliary selection signals ($\overline{X}_{co-csi}, \overline{Y}_{co-csj}$) to select other side access memories adjacent to said selected slide access memory.

5. A device as set forth in claim 4, wherein each of said slide access memories further comprises:

a plurality of memory cell blocks (B$_{00}$ to B$_{33}$);

row selecting means (RD0 to RD3) provided for each column of said memory cell blocks respectively;

a first switching means (RSW), connected to said row selecting means, for supplying a row address (A$_R$) or a row address (A$_R$+1) adjacent to said row address to each of said row selecting means;

a second switching means (CSW), connected to said column selecting means, for supplying a column address (A$_C$) or a column address (A$_C$+1) adjacent to said column address to each of said column selecting means;

a rearranging means (BAC), connected to said memory cell blocks, for rearranging cells of said memory cell blocks selected by said row selecting means and said column selecting means, to interconnect the rearranged cells (MD$_0$ to MD$_{15}$) to corresponding input/output portions.

6. A device as set forth in claim 4, wherein said first access means further comprises means for supplying the same row and column addresses (RA0 to RA9, CA0 to CA9) to all of said slide access memories.

7. A slide access memory comprising:

data input/output ports (D$_0$ to D$_{15}$);

a main memory circuit (701), in which a group of bits can be accessed by receiving address signals (RA0 to RA9, CA0 to CA9);

a latch circuit for connecting an accessed voluntary rectangular group of bits to data input/output terminals (D$_0$ to D$_{15}$); and a logic circuit (703), connected to said latch circuit, for receiving a chip selection signal ($\overline{X}_{csi}, \overline{Y}_{csj}$), said address signals, and a selection signal ($\overline{I}_1, \overline{I}_2, \overline{I}_3$) to generate mask signals (W$_k$, R$_k$) and selection signals ($\overline{O}_1, \overline{O}_2, \overline{O}_3$) for adjacent chips, said mask signals being transmitted to said latch circuit thereby enabling or disabling the corresponding bits thereof.

8. A memory as set forth in claim 7, wherein said logic circuit generates said mask signals in accordance with a special bit (PB) defined by said address signals when said memory is selected by said chip selection signal, and generates said selection signals for adjacent chips only when said special bit is located in a special region of said main memory circuit.

9. A memory as set forth in claim 7, wherein said logic circuit generates said mask signals in accordance with a special bit (PB) defined by said address signals and inverts said mask signals in accordance with said selection signal ($\overline{I}_1, \overline{O}_2, \overline{O}_3$) when said memory is selected by said selection signal.

10. A slide access memory comprising:

data input/output ports ($D_0$ to $D_{15}$);

a main memory circuit (701), in which a group of bits can be accessed by receiving address signals (RA0 to RA9, CA0 to CA9);

a latch circuit for connecting an accessed voluntary rectangular group of bits to data input/output terminals ($D_0$ to $D_{15}$); and a logic circuit (703), connected to said latch circuit, for receiving a chip selection signal ($\overline{X}_{csi}$, $\overline{Y}_{csj}$), said address signals, and an auxiliary signal ($\overline{X}_{co\text{-}csi}$, $\overline{Y}_{co\text{-}csj}$) to generate mask signals ($W_k$, $R_k$), said mask signals being transmitted to said latch circuit enabling or disabling the corresponding bits thereof.

11. A memory as set forth in claim 10, wherein said logic circuit generates said mask signals in accordance with a special bit (PB) defined by said address signals when said memory is selected by said chip selection signal.

12. A memory as set forth in claim 10, wherein said logic circuit generates said mask signals in accordance with a special bit (PB) defined by said address signals and inverts said mask signals in accordance with said auxiliary signal when said memory is selected by said auxiliary signal.

* * * * *